(12) United States Patent
Brannstrom et al.

(10) Patent No.: US 8,407,551 B2
(45) Date of Patent: Mar. 26, 2013

(54) LOW COMPLEXITY LDCP DECODING

(75) Inventors: Fredrik Brannstrom, Mountain View, CA (US); Andrea Goldsmith, Menlo Park, CA (US)

(73) Assignee: Quantenna Communications, Inc., Fremont, CA (US)

( * ) Notice: Subject to any disclaimer, the term of this patent is extended or adjusted under 35 U.S.C. 154(b) by 459 days.

(21) Appl. No.: 12/653,657

(22) Filed: Dec. 15, 2009

(65) Prior Publication Data

US 2010/0162075 A1    Jun. 24, 2010

Related U.S. Application Data

(60) Provisional application No. 61/122,648, filed on Dec. 15, 2008.

(51) Int. Cl.
*H03M 13/29*        (2006.01)
(52) U.S. Cl. ...................................................... 714/752

(58) Field of Classification Search .................. 714/781, 714/752
See application file for complete search history.

(56) References Cited

U.S. PATENT DOCUMENTS

| 6,910,170 | B2 * | 6/2005 | Choi et al. ...................... 714/755 |
| 7,251,769 | B2 * | 7/2007 | Ashikhmin et al. .......... 714/755 |
| 7,418,051 | B2 * | 8/2008 | Kramer et al. ................ 375/265 |
| 7,669,105 | B2 * | 2/2010 | Pisek et al. .................... 714/755 |
| 2003/0076890 | A1 * | 4/2003 | Hochwald et al. ............. 375/264 |
| 2005/0210367 | A1 * | 9/2005 | Ashikhmin et al. .......... 714/801 |
| 2012/0128102 | A1 * | 5/2012 | Sokolov et al. ............... 375/340 |

* cited by examiner

*Primary Examiner* — Amine Riad

(57) ABSTRACT

A technique for low-density parity-check (LDPC) coding involves utilizing a fixed point implementation in order to reduce or eliminate reliance on floating point operations. The fixed point implementation can be used to calculate check node extrinsic L-value as part of an LDPC decoder in an LDPC system. The technique can include one or more of linear approximations, offset approximations, and node-limiting approximation. A system constructed according to the technique implements one or more of linear approximations, offset approximations, and node-limiting approximation.

10 Claims, 13 Drawing Sheets

400 ➤

LOW COMPLEXITY LDCP DECODING

CROSS-REFERENCE TO RELATED APPLICATIONS

This application claims priority to U.S. Provisional Patent Application No. 61/122,648, filed on Dec. 15, 2008, and which is incorporated by reference.

BACKGROUND

Digital modulation systems use a finite number of distinct signals to represent digital data. Phase-shift keying (PSK) is a digital modulation scheme that conveys data by changing, or modulating, the phase of a reference signal (the carrier wave). PSK systems use a finite number of phases, each assigned a unique pattern of binary bits. Each pattern of bits forms a symbol that is represented by the particular phase. A demodulator, which is designed for the symbol-set used by a modulator, determines the phase of the received signal and maps it back to the symbol it represents, thus recovering original data. This requires the receiver to be able to compare the phase of a received signal to a reference signal.

Alternatively, instead of using the bit patterns to set the phase of a wave, a PSK system can instead change the phase of the wave by a specified amount. The demodulator determines the changes in the phase of a received signal rather than the phase itself. Since such a system relies on the difference between successive phases, it is termed differential PSK (DPSK). DPSK can be significantly simpler to implement than ordinary PSK since there is no need for the demodulator to have a copy of the reference signal to determine the exact phase of the received signal (it is a non-coherent scheme), but produces more erroneous demodulations.

Binary PSK (BPSK) uses two phases which are separated by 180°. Constellation points can be treated as if at 0° and 180° on an axis because it does not particularly matter exactly where the constellation points are positioned. Variations include quadrature PSK (QPSK), offset QPSK (OQPSK), π/4-QPSK, higher order PSK, etc.

Quadrature amplitude modulation (QAM) is both an analog and a digital modulation scheme. QAM conveys two analog message signals, or two digital bit streams, by modulating the amplitudes of two carrier waves, using the amplitude-shift keying (ASK) digital modulation scheme or amplitude modulation (AM) analog modulation scheme. These two waves are out of phase with each other by 90° and are thus called quadrature carriers or quadrature components. The modulated waves are summed, and the resulting waveform is a combination of both PSK and amplitude-shift keying, or in the analog case of phase modulation (PM) and AM. In the digital QAM case, a finite number of at least two phases and at least two amplitudes are used. PSK modulators are often designed using the QAM principle, but are not considered as QAM since the amplitude of the modulated carrier signal is constant.

A low-density parity-check (LDPC) code is a linear error correcting code, a method of transmitting a message over a noisy transmission channel, and is constructed using a sparse bipartite graph. LDPC codes are capacity-approaching codes, which means that practical constructions exist that allow a noise threshold to be set very close to the theoretical maximum (the Shannon limit) for a memory-less channel. The noise threshold defines an upper bound for the channel noise up to which the probability of lost information can be made as small as desired. Using iterative belief propagation techniques, LDPC codes can be decoded in time linear to their block length. Low Density Parity Check Codes, Number 21 in Research monograph series, R. Gallager, 1963—MIT Press, Cambridge, Mass. is incorporated by reference.

SUMMARY

The following is described and illustrated in conjunction with systems, tools, and methods that are meant to be exemplary and illustrative, not limiting in scope. Techniques are described to address one or more of deficiencies in the state of the art.

A technique for low-density parity-check (LDPC) coding involves utilizing a fixed point implementation in order to reduce or eliminate reliance on floating point operations. The fixed point implementation can be used to calculate check node extrinsic L-value as part of an LDPC decoder in an LDPC system. The technique can include one or more of linear approximations, offset approximations, and node-limiting approximation. A system constructed according to the technique implements one or more of linear approximations, offset approximations, and node-limiting approximation.

BRIEF DESCRIPTION OF THE DRAWINGS

Examples of the claimed subject matter are illustrated in the figures.

DETAILED DESCRIPTION

In the following description, several specific details are presented to provide a thorough understanding of examples of the claimed subject matter. One skilled in the relevant art will recognize, however, that one or more of the specific details can be eliminated or combined with other components, etc. In other instances, well-known implementations or operations are not shown or described in detail to avoid obscuring aspects of the claimed subject matter.

Figure 1:
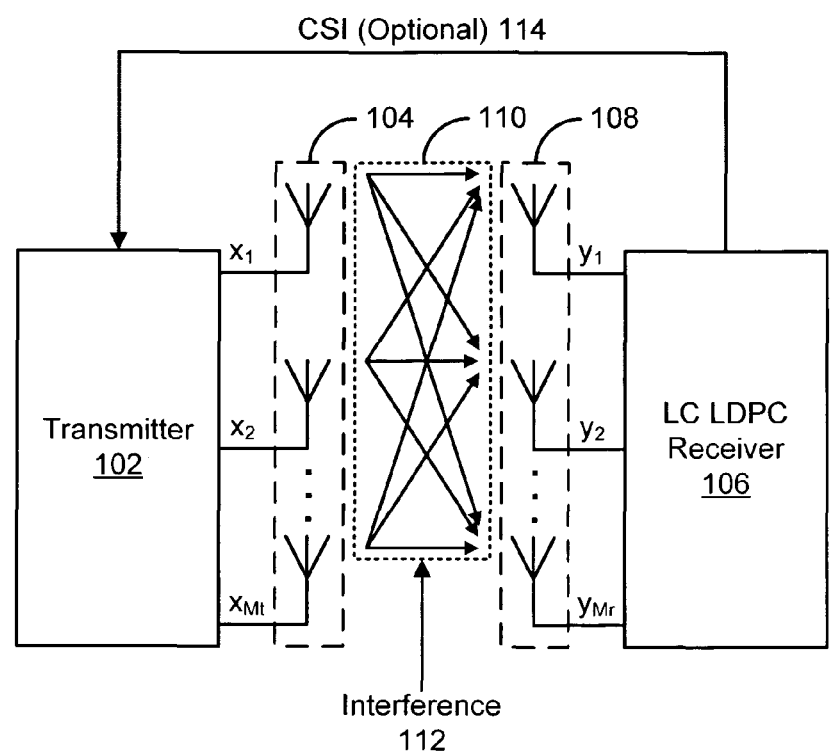
FIG. 1 depicts an example of a system including a low-complexity (LC) low-density parity-check (LDPC) receiver.

FIG. 1 depicts an example of a system 100 including a low-complexity (LC) low-density parity-check (LDPC) receiver. The system 100 includes a transmitter 102 with a transmit (Tx) antennae array 104 and an LC LDPC receiver 106 with a receive (Rx) antennae array 108. The components 102, 104 can be implemented in a first station and the components 106, 108 can be implemented in a second station in a typical implementation, but the components could be implemented atypically in alternative implementations while still benefiting from the described techniques.

A station, as used in this paper, may be referred to as a device with a media access control (MAC) address and a physical layer (PHY) interface to a wireless medium that complies with the Institute of Electrical and Electronics Engineers (IEEE) 802.11 standard. In alternative embodiments, a station may comply with a different standard than IEEE 802.11, or no standard at all, may be referred to as something other than a "station," and may have different interfaces to a wireless or other medium. IEEE 802.11a-1999, IEEE 802.11b-1999, IEEE 802.11g-2003, IEEE 802.11-2007, and IEEE 802.11n-2009 are incorporated by reference. As used in this paper, a system that is 802.11 standards-compatible or 802.11 standards-compliant complies with at least some of one or more of the incorporated documents' requirements and/or recommendations, or requirements and/or recommendations from earlier drafts of the documents.

The system 100 is depicted in the example of FIG. 1 as a multiple-input multiple-output (MIMO) system. It should be noted that multiple-input and single-output (MISO), single-input and multiple-output (SIMO), and single-input and single-output (SISO) are special cases of MIMO. MISO is when the receiver has a single antenna. SIMO is when the transmitter has a single antenna. SISO is when neither the transmitter nor the receiver have multiple antennae. As used in this paper, techniques may be applicable to any of these special cases, depending upon whether the techniques can be used with one Tx antenna and/or one Rx antenna. Thus, the acronym MIMO could be considered to include the special cases, if applicable. The techniques may also be applicable to multi-user MIMO (MU-MIMO), cooperative MIMO (CO-MIMO), MIMO routing, OFDM-MIMO, or other MIMO technologies.

In the example of FIG. 1, the Tx antennae array 104 is operationally connected to the transmitter 102. Generally as used in this paper, an antennae array includes multiple antennae coupled to a common source or load to produce a directive radiation pattern. The spatial relationship can contribute to the directivity of the antennae.

In the example of FIG. 1, in operation, the Tx antennae array 104 has $x_k$ as input. The value of k varies from 1 to $M_t$, where $M_t$ is the number of antennae in the Tx antennae array 104. It may be noted that the Tx antennae array 104 may or may not also act as an Rx antennae array under certain circumstances that depend upon the implementation, configuration, and environmental variables. For example, the transmitter 102 could act as a transceiver, alternating use of the Tx antennae array 104 as Tx antennae with use of the antennae array as Rx antennae. Thus, in the example of FIG. 1, the Tx designation could simply represent a current use of the antennae array for transmission. It may also be noted that in an alternative embodiment, an array could contemporaneously have a first subset of antennae acting as Tx antennae and a second subset of antennae acting as Rx antennae (not shown).

An (N,K) linear block code can be specified by its K×N generator matrix $G \in \{0, 1\}^{K \times N}$ or by its M×N parity check matrix $H \in \{0, 1\}^{M \times N}$, where M=N−K. The rate of the code is R=K/N. Let $$u = [u_1, u_2, \ldots, u_K] \in \{0, 1\}^K \quad (1)$$

denote a message to be encoded (information bits). The codeword $c = [c_1, c_2, \ldots, c_N] \in \{0, 1\}^N$ corresponds to the message u, and the parity check equation is $Hc^T = 0$, where the matrix multiplication is in GF(2). The parity check matrix can be split into two parts, $H_1$ and $H_2$, according to $$H = \left[\underbrace{\overset{K}{H_1} \mid \overset{M}{H_2}}_{N}\right] \Big\} M = N - K.$$

The parity check equation can then be written as $$Hc^T = [H_1 \ H_2]\begin{bmatrix} u^T \\ p^T \end{bmatrix} = H_1 u^T + H_2 p^T = 0. \quad (2)$$

Equation (1), (2) yields the expression $p^T = H_2^{-1} H_1 u^T$. Hence, the systematic form of G can be expressed in terms of $H_1$ and $H_2$:

$$G = [G_1 \ G_2] = \left[\underbrace{\overset{K}{I} \mid \overset{M}{(H_2^{-1} H_1)^T}}_{N}\right] \Big\} K,$$

where I is the identity matrix of size K×K. The codeword can be generated by c=uG, where the first K bits in c are equal to u and the last M=N−K bits in c are the parity bits $c = [u, p] = [u_1, u_2, \ldots, u_K, p_1, p_2, \ldots, p_M] \in \{0, 1\}^N$.

Before transmission, a codeword is mapped to a symbol constellation, e.g., BPSK, QPSK, QAM, etc. Assuming BPSK symbols $X \in \{-1, +1\}^N$, X is defined as 2c−1. The symbols are transmitted over an additive white Gaussian noise (AWGN) channel, where the received matched filter outputs are Y=aX+σW. The elements in W are zero-mean Gaussian random variables with unit variance, a is the received signal amplitude and σ is the standard deviation of the additive noise. Let $E_s$ and $E_b$ denote the symbol and information bit energy, respectively. This means that the amplitude is $a = (E_s)^{-1/2} = (RE_b)^{-1/2}$. Let the variance $\sigma^2 = N_0/2$, where $N_0$ is the one sided power spectral density of the additive noise.

A parity check matrix can also be visualized by a Tanner graph with variable nodes (on the left) representing the coded bits and check nodes (on the right) representing the parity checks. A Tanner graph is a bipartite graph used to specify constraints or equations that specify error correcting codes. Tanner graphs can be used to construct longer codes from smaller ones. A Recursive Approach to Low Complexity Codes, Tanner, R., IEEE Transactions on Information Theory, Volume 27, Issue 5, pp. 533-547 (September 1981) is incorporated by reference.

Channel L-values can be denoted by $L_n$ and come from the channel to the variable node edges of a Tanner graph. The L-values generated by variable node, n, for check node, m, can be denoted by $V_{m,n}$. The L-values generated by check node, m, for variable node n can be denoted by $C_{m,n}$. When $d_v(n)$ and $d_c(m)$ are not the same for all n and m, the code can be referred to as a variable and check irregular code. A variable regular code, on the other hand, has $d_v(n) = d_v$ for all n=1, 2, . . . , N. A check regular code has $d_c(m) = d_c$ for all m=1, 2, . . . , M.

The 12 LDPC codes used in 802.11n are variable and check irregular codes. Each of the parity-check matrices for the LDPC codes used in IEEE 802.11n can be partitioned into square subblocks (submatrices) of size Z×Z. These submatrices are either cyclic-permutations of the identity matrix or null submatrices. The cyclic-permutation matrix $x^k$ is obtained from the Z×Z identity matrix by cyclically shifting the columns to the right by k elements. The matrix $x^0$ is the Z×Z identity matrix. The $H_1$ matrices for the 12 LDPC codes in 802.11n are all different (see IEEE 802.11n-2009 for the matrix prototypes for all 12 LDPC codes in 802.11n). However, $H_2$ (and consequently $H_2^{-1}$) only depend on the code rate R.

IEEE 802.11a-1999, IEEE 802.11b-1999, IEEE 802.11g-2003, IEEE 802.11-2007, and IEEE 802.11n-2009 are incorporated by reference. As used in this paper, a system that is 802.11 standards-compatible or 802.11 standards-compliant complies with at least some of one or more of the incorporated documents' requirements and/or recommendations.

In the example of FIG. 1, the LC LDPC receiver 106 is low complexity because it can decode signals using relatively few operations, as described later. In the example of FIG. 1, the Rx antennae array 108 is operationally connected to the LC LDPC receiver 106. For illustrative simplicity, it is assumed, unless explicitly stated, that the LC LDPC receiver 106 includes the Rx antennae array 108. Thus, the LC LDPC receiver 106 can be referred to as capable of functionality that requires the use of antennae.

In the example of FIG. 1, in operation, the $x_k$ signals are transmitted over MIMO channel 110 in $N_s$ independent spatial streams. Interference 112 can be introduced into the MIMO channel 110.

In the example of FIG. 1, the Rx antennae array 108 has $y_k$ as input signals. The input signals include the interference 112 introduced into the MIMO channel 110. The value of k (as a subscript of y) varies from 1 to $M_r$, where $M_r$ is the number of antennae in the Rx antennae array 108. It may be noted that the Rx antennae array 108 may or may not also act as a Tx antennae array under certain circumstances that depend upon the implementation, configuration, and environmental variables. For example, the LC LDPC receiver 106 could act as a transceiver, alternating use of the Rx antennae array 108 as Rx antennae with use of the antennae array as Tx antennae. Thus, in the example of FIG. 1, the Rx designation could simply represent a current use of the antennae array for transmission. It may also be noted that in an alternative embodiment, an array could contemporaneously have a first subset of antennae acting as Tx antennae and a second subset of antennae acting as Rx antennae (not shown).

In the example of FIG. 1, in operation, the LC LDPC receiver 106 provides optional channel state information (CSI) 114 to the transmitter 102. The availability and quality of CSI enable the transmitter 102 to adapt transmit precoding. The transmitter 102 can use the CSI to compute a precoder for interference suppression at the transmitter 102. It may be noted that in special cases of MIMO, such as SISO, precoding is not used because there are not multiple antennae to weight.

Precoding, as used in this paper, is used in conjunction with multi-stream transmission in MIMO radio systems. In precoding, the multiple streams of the signals are emitted from the transmit antennas with independent and appropriate weighting per each antenna such that some performance metric such as the link throughput is maximized at the receiver output. Note that precoding may or may not require knowledge of channel state information (CSI) at the transmitter. Some benefits of precoding include increasing signal gain on one or more streams through diversity combining, reducing delay spread on one or more streams, providing unequal signal-to-noise ratio (SNR) per stream for different quality of service (QoS).

Beamforming, as used in this paper, is a special case of precoding for a single-stream so that the same signal is emitted from each of the transmit antennas with appropriate weighting such that some performance metric such as the signal power is maximized at the receiver output. Some benefits of beamforming include increasing signal gain through diversity combining and reducing delay spread.

A MIMO antennae configuration can be used for spatial multiplexing. In spatial multiplexing, a high rate signal is split into multiple lower rate streams, which are mapped onto the Tx antennae array. If these signals arrive at an Rx antennae array with sufficiently different spatial signatures, the receiver can separate the streams, creating parallel channels. Spatial multiplexing can be used to increase channel capacity. The maximum number of spatial streams is limited by the lesser of the number of antennae at the transmitter and the number of antennae at the receiver. Spatial multiplexing can be used with or without transmit channel knowledge.

Figure 2:
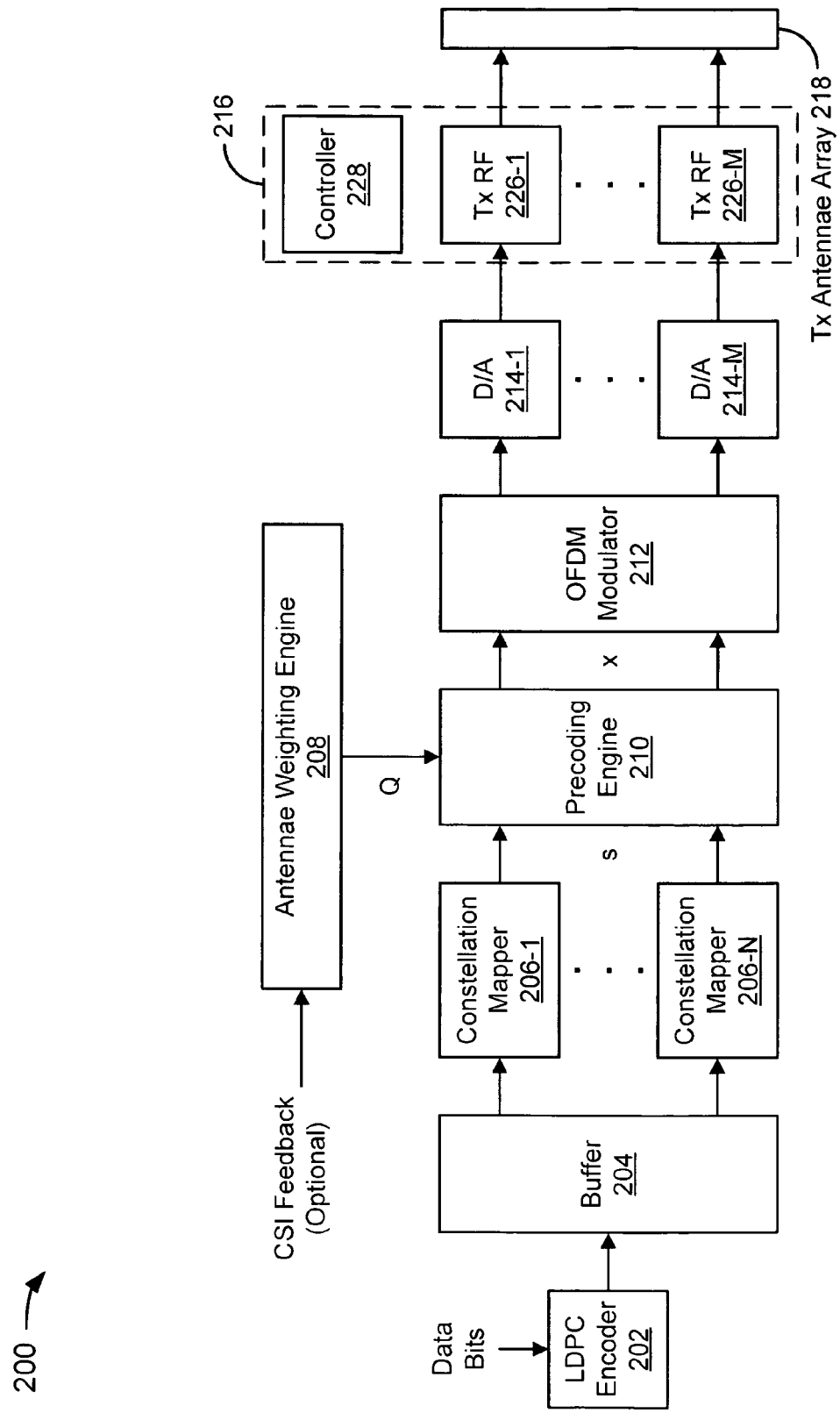
FIG. 2 depicts an example of a device suitable for use as a transmitter to an LC LDPC receiver.

FIG. 2 depicts an example of a device 200 suitable for use as a transmitter to an LC LDPC receiver. The device 200 includes an LDPC encoder 202, a buffer 204, constellation mappers 206-1 to 206-N (referred to collectively as constellation mappers 206), an antennae weighting engine 208, a precoding engine 210, a modulator 212, digital-to-analog (D/A) converters 214-1 to 214-M (referred to collectively as D/A converters 214), a radio frequency (RF) module 216, and Tx antennae array 218.

In the example of FIG. 2, data bits are encoded at the LDPC encoder 202. For encoding, let S denote the number of rows in a matrix representation of H. In 802.11n, $H_2^{-1}$ has similar structures for all codes. The first row is all ones. The second row through row S/2+1 have a triangular structure where the upper part is x and the lower part is x+1. Row S/2+2 through row S have also a triangular structure where the upper part is x+1 and the lower part is x.

The encoding of the LDPC codes used in, for example, 802.11n can be expressed recursively due to the structured form of $H_2^{-1}$. The LDPC codes in 802.11n have Z∈{27, 54, 81} and S∈{12, 8, 6, 4}, such that N=24Z and M=SZ. The encoding can be expressed as $$w^T = H_1 u^T = [w_1, w_2, \ldots, w_s]^T, \quad (3)$$

$$p^T = H_2^{-1} w^T = [p_1, p_2, \ldots, p_s]^T, \quad (4)$$

where $w_k$ and $p_k$ are binary row vectors of size Z for k=1, 2, . . . , S.

The matrix multiplication in (3) can easily be implemented since the nonzero entries of are Z×Z right circulant permutation matrices. Each $w_j$ is a shifted version of $u_j$ by the corresponding power of x in the (i, j) entry of the matrix prototype $H_1$ and summing the results over i. If the (i, j) entry of the matrix $H_1$ is zero, there is no contribution of $u_i$ to the sum. This can be implemented by, for example, barrel shift registers.

In the example of FIG. 2, the coded bits are demultiplexed into $N_s$ independent spatial streams and stored in the buffer 204. It is conceivable that a system could be implemented in which the spatial streams are provided without storage in a buffer, or with a plurality of buffers. This component, and other components of the example of FIG. 2, could be replaced with alternative components that are capable of providing a signal associated with data bits to the Tx antennae array 218 for transmission onto a MIMO, or special case of MIMO, channel. In special cases of MIMO (i.e., SISO or SIMO), there is only one independent spatial stream, obviating the need for demultiplexing.

In the example of FIG. 2, the spatial streams are mapped to constellation symbols, such as quadrature amplitude modulation (QAM) at the constellation mappers 206. The number of constellation mappers 206 will typically correspond to the number of spatial streams, $N_s$, though it is conceivable that a system could have more (perhaps unused) or fewer (though this would be of dubious value using state of the art techniques) constellation mappers. The constellation symbols are collected to form the $N_s \times 1$ constellation vector s. In certain special cases of MIMO (i.e., SISO or SIMO), there may be only a single constellation mapper 206 for the single spatial stream.

In the example of FIG. 2, the antennae weighting engine 208 receives optional CSI from, e.g., a receiver. The CSI can be used to compute a channel estimate, H', (or the CSI could include the channel estimate, H'). An example of a representation of a channel is H=H'+HA, where HA is the estimation error. The antennae weighting engine 208 can receive, compute, and/or have stored a weighting matrix, M. Using these values, a precoding matrix, Q, could be represented as $Q=M^{1/2}H'$. Thus, the precoding matrix could be referred to as a modified channel estimate. Where no H' is provided, due to a lack of CSI, the precoding matrix, Q, could be represented as $Q=M^{1/2}$ (or simply as M). Regardless of the implementation-specific details, the antennae weighting engine 208 provides the precoding matrix, Q, to the precoding engine 210.

In the example of FIG. 2, the constellation vector s and the precoding matrix Q are passed to the precoding engine 210. In this example, the precoding engine generates an $M_t \times 1$ transmitted vector x, where x=Qs. Alternatively, the constellation vector s and the precoding matrix Q could be combined in some other manner. In certain special cases of MIMO (i.e., SISO or SIMO), there may be no need for antennae weighting because there is a single antennae, making the antennae weighting engine 208 and the precoding engine 210 optional.

In the example of FIG. 2, the vector x is modulated onto one or more frequencies at the modulator 212. The modulator can be of a known or convenient type, such as an orthogonal frequency division multiplexing (OFDM) modulator. OFDM modulators multiplex data onto multiple orthogonal frequencies.

The vector x is converted to analog waveforms at the D/A converters 214. The number of D/A converters 214 will typically correspond to the number of Tx antennae in the Tx antennae array 218, though it is conceivable that a system could have more or fewer D/A converters. In certain special cases of MIMO (i.e., SISO or SIMO), there may be only a single D/A converter 214 for the single spatial stream.

In the example of FIG. 2, the analog waveforms are upconverted to the desired carrier frequency at the RF module 216. The RF module 216 includes Tx radio frequency (RF) chains 226-1 to 226-M (referred to collectively as Tx RF chains 226) and, typically, a controller 228. The analog waveforms are provided through the Tx RF chains 226 (the number of Tx RF chains 226 will typically correspond to the number of Tx antennae in the Tx antennae array 218) to the Tx antennae array 218 for transmission. The Tx RF chains 226 are part of a circuit that includes the controller 228, which is capable of tuning to a desired carrier frequency. Although a controller is useful in many implementations, it is possible to implement a transmitter that is not tuned with a controller, making the controller 228 optional.

Figure 3:
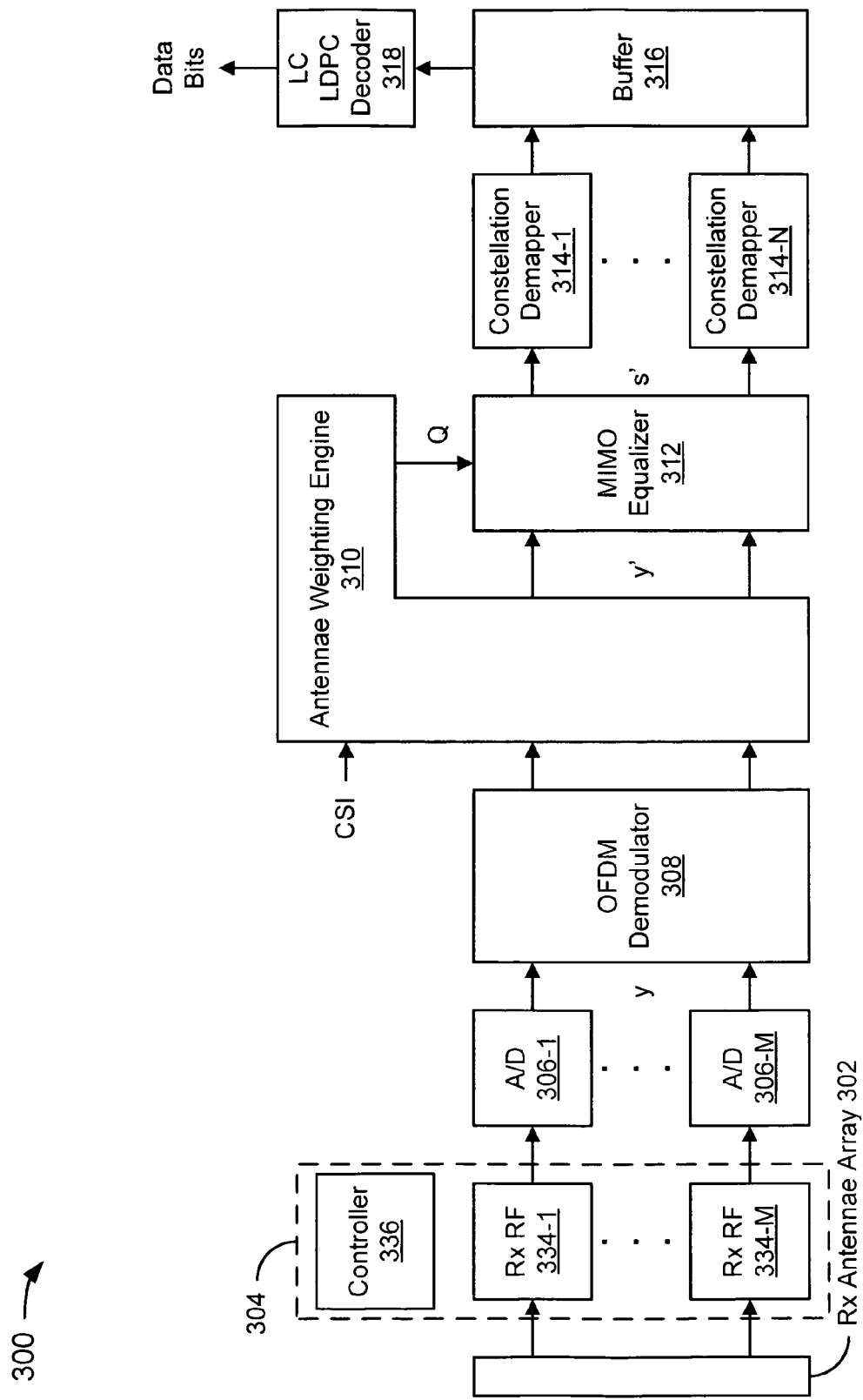
FIG. 3 depicts an example of a device suitable for use as an LC LDPC receiver.

FIG. 3 depicts an example of a device 300 suitable for use as an LC LDPC receiver. The device 300 includes an Rx antennae array 302, an RF module 304, analog-to-digital (ND) converters 306-1 to 306-M (referred to collectively as the A/D converters 306), a demodulator 308, an antennae weighting engine 310, a MIMO equalizer 312, constellation demappers 314-1 to 314-N (referred to collectively as the constellation demappers 314), a buffer 316, and an LC LDPC decoder 318.

In the example of FIG. 3, signals are collected by the Rx antennae array 302, downconverted to baseband at the RF module 304. The RF module 304 includes Rx RF chains 334-1 to 334-M (referred to collectively as the Rx RF chains 334) and a controller 336. The Rx RF chains 334 are part of a circuit that includes the controller 336, which is capable of tuning to a desired carrier frequency.

In the example of FIG. 3, the analog baseband waveforms are digitized at the ND converters 306 to produce an $M_r \times 1$ digital received vector y. In certain special cases of MIMO (i.e., SISO or MISO), there may be only a single ND converter 306 for the single spatial stream.

In the example of FIG. 3, the digital received vector y is demodulated at the demodulator 308. The modulator can be of a known or convenient type, such as an OFDM demodulator. OFDM demodulators demultiplex data from multiple orthogonal frequencies.

The antennae weighting engine 310 receives the demodulated received vector y, and can receive other values, as well, such as, e.g., CSI (shown) and interference measurements (not shown). The antennae weighting engine 310 can receive, compute, and/or have stored a weighting matrix, M, and generates a weighted vector $y'=M^{1/2} y$. In an alternative embodiment, the weighted vector y' could combine M and y in some other manner than matrix-vector multiplication. The CSI can be used to compute a channel estimate, H', (or the CSI could include the channel estimate, H'). Using these values, a precoding matrix, Q, could be represented as $Q=M^{1/2}H'$. In an alternative embodiment, the matrix Q could combine M and H' in some other manner than matrix multiplication. Regardless of the implementation-specific details, the antennae weighting engine 310 provides the precoding matrix, Q, to the MIMO equalizer 312.

In the example of FIG. 3, the MIMO equalizer 312 receives the weighted vector y' and the matrix, Q, from the antennae weighting engine 310. The MIMO equalizer 312 equalizes the weighted vector y' using the modified channel estimate represented by Q to form an $N_s \times 1$ equalized vector s'.

In the example of FIG. 3, the equalized vector s' is provided to the constellation demappers 314. The $N_s$ data streams are multiplexed into a single stream (unless already in a single stream, such as in SISO). The channel L-values, $L_n$, for a codeword are calculated in the constellation demappers 314 and put in the buffer 316. For BPSK and AWGN channel, for example, the channel L-value for coded bit $c_n$ is calculated as $L_n = 2a(\sigma^2)^{-1} Y_n$, n=1, 2, ..., N. (Note that both a and $\sigma^2$ are known.) While BPSK is used in this example, it should be noted that some of these calculations are applicable for some, if not all, PSK and QAM modulations, and the technique is applicable to all.

In the example of FIG. 3, the LC LDPC decoder 318 obtains data bits from the codeword in the buffer 316. The LC LDPC decoder 318 can be implemented as layered decoding where Z rows in H are decoded at the same time, since the structure of the parity check matrix H makes sure that each column within the same layer has only one or zero 1s, as it is in 802.11-n. That is, the LC LDPC decoder 318 can be implemented such that the Z rows within a layer do not access the same memory at the same time. The order the S layers are decoded can be optimized to minimize latency and idle clocks.

The LC LDPC decoder 318 can have an initialization stage before the decoding of each code word starts, where the check node L-values $C_{m,n}$ are reset to zero. A posteriori probability (APP) L-values, $P_n$, are therefore initialized with the channel L-values, $L_n$, since $C_{m,n}=0$. After each layer, the N sign bits of an APP $P_n$ (codeword) can be found and stored: $\hat{c}_n=0$ if $P_n \geq 0$, 1 if $P_n<0$, n=1, 2, ..., N. When the same codeword has been found after T consecutive layers have been decoded, it can optionally be checked whether it is a valid codeword according to the parity check equation $H\hat{c}^T=0$. If one or two criteria are fulfilled, decoding of the codeword can optionally stop. Note that T can be larger, smaller, or equal to S.

The extrinsic L-value for a variable node sent to check node, k, is the sum of all connections except the connection to check node k: $V_k=L+\Sigma(i \neq k)C_i=P-C_k$, k=1, 2, ..., $d_v$. The LC LDPC decoder 318 iterates between the variable nodes updating the variable nodes, $V_k$, and the check nodes, $C_k$. One iteration is defined as one update of all variable nodes and one update of all check nodes. The iterations between variable nodes and check nodes continue until a predetermined number of iterations is reached or until some other criteria is met (for example a valid codeword is found, or the same valid codeword is found after T consecutive decoding layers). After finishing the iterations, the code word is simply the MSBs of the APP L-values based on the most recent check node L-values according to $P=L+\Sigma(t=1 \ldots d_v)C_i$ and $\hat{u}=0$ if $P \geq 0$, 1 if $P<0$. The APP L-value for coded bit n can be calculated as the sum of all check node L-values connected to variable node n plus the channel L-value for coded bit n. $P_n=L_n+\Sigma(m=1 \ldots M)C_{m,n}H_{m,n}$, n=1, 2, ..., N, where $H_{m,n}$ is used to pick out the check nodes connected with variable node, n. The decision for the information bits are based on the first K APP values according to $\hat{u}_k=0$ if $P_k \geq 0$, 1 if $P_k<0$, k=1, 2, ..., K. For simplicity of notation, the index, n, can be dropped such that $P=L+\Sigma(t=1 \ldots d_v)C_i$ and $\hat{u}=0$ if $P \geq 0$, 1 if $P<0$.

The extrinsic L-value for a check node sent to variable node, k, is based on all connections except the connection to variable node k:

$$C_k = 2\tanh^{-1}(\Pi(i \neq k)(V_i/2)); \quad (5.1)$$

$$C_k = \ln\{[1-\Pi(i \neq k)((1-\exp(V_i))/(1+\exp(V_i)))]/[1+\Pi(i \neq k)((1-\exp(V_i))/(1+\exp(V_i)))]\}; \quad (5.2)$$

$$C_k = \Pi(j \neq k)\alpha_j \phi(\Sigma(i \neq k)\phi(\beta_i)) = U_k \phi(E_k); \quad (5.3)$$

$$C_k = U_k \phi(E_k) = \Pi(j \neq k)\alpha_j(\Sigma(i \neq k) \boxplus \beta_i = \Sigma(j \neq k) \boxplus V_j; \quad (5.4)$$

where k=1, 2, ..., $d_c$.

The equations (5.1) to (5.4), which can be referred to collectively as the equation (5), can be solved to obtain $C_k$. A first potential approach to solving for $C_k$ (5.1) requires two look-up tables, one for tanh and one for $\tanh^{-1}$, together with many multiplications.

The equation (5.1) can be rewritten as equation (5.2). A second potential approach to solving for $C_k$ (5.2) requires two look-up tables, one for ln and one exp, together with many multiplications and divisions.

The L-values from the variable nodes can be represented by sign-abs where $V_i=\alpha_i\beta_i$, where $\alpha_i$ is defined as sign ($V_i$), and where $\beta_i$ is defined as $|V_i|$. Using the sign-abs representation the equation (5.2) can be rewritten as equation (5.3), where $\phi(x)=\ln[(\exp(x)+1)/(\exp(x)-1)]$, and the expression can be conceptually divided into a first part, $U_k$, and a second part, $F_k$, where $U_k$ is defined as $\Pi(j \neq k)\alpha_j$, $F_k$ is defined as $\phi(E_k)$, and $E_k$ is defined as $\Sigma(i \neq k)\phi(\beta_i)$. A third potential approach (5.3) is referred to in this paper as the sum-product (SP) approach (SPA).

To solve for the second part, $F_k$, the values for each $\phi(\beta_k)$ are obtained from a $\phi$ lookup table. Since there are defined to be a total of $d_c$ edges going into the check node, a total of $d_c$ lookups are necessary to obtain the values. The values for each of the $d_c$ summations are then obtained from the $\phi$ lookup table, bringing the total number of lookup operations to $2d_c$.

To solve for the first part, $U_k$, it is first noted that the sign bits $\alpha_j \in \{+1,-1\}$, and $U_k=\Pi(j \neq k)\alpha_j=\alpha_k U$, where U, defined as $\Pi(j=1 \ldots d_c)\alpha_j$, is identical for all k=1, 2, ..., $d_c$. An equivalent solution is to use the MSB of $V_j$ represented by $\alpha_j^* \in \{0,1\}$, $U_k^*=\alpha_k^* \oplus U^*$, where $\oplus$ is the XOR operation and $U^*$, defined as $\Sigma(j=1 \ldots d_c) \oplus \alpha_j^*$, is identical for all k=1, 2, ..., $d_c$.

Figure 4:
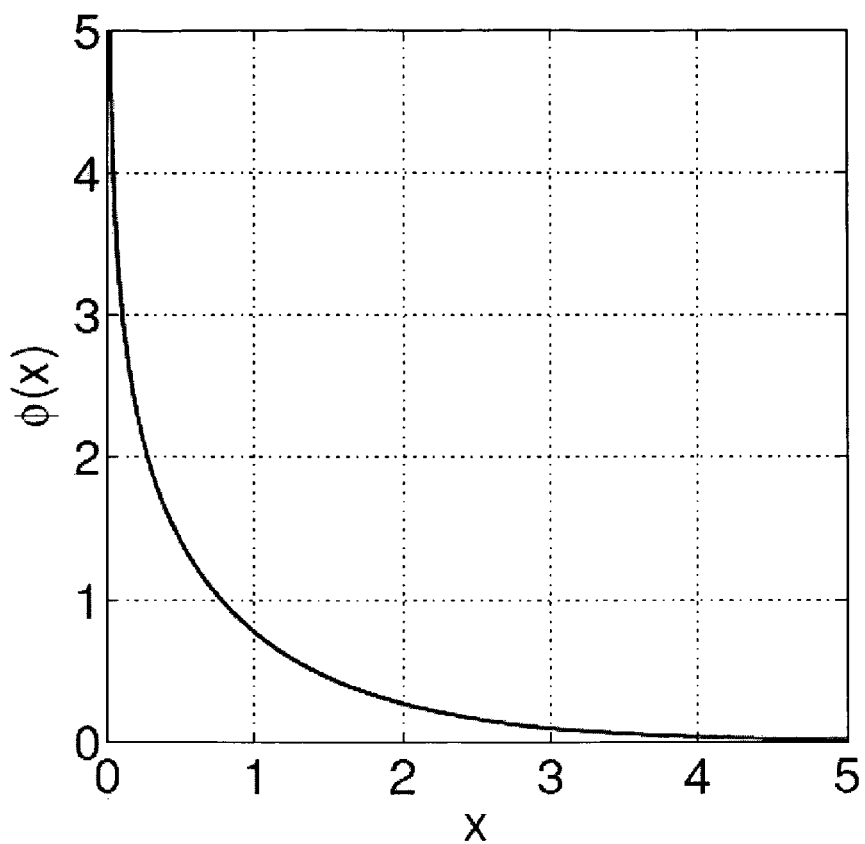
FIG. 4 depicts a graph of an SP function.

FIG. 4 depicts a graph 400 of an SP function $\phi(x)$. FIG. 4 is intended to show that $\lim(x \to 0)\phi(x)=+\infty$ and $\lim(x \to \infty)\phi(x)=0$. FIG. 4 also illustrates that $\phi(x)>0$ for any $0 \leq x \leq \infty$, and that $\phi$ is self-invertible:

$$\phi(x)>0, x<\infty. \quad (6)$$

$$\phi(\phi(x))=x. \quad (7)$$

A fourth potential approach (5.4) is referred to in this paper as the box-plus (BP) approach (BPA). It may be noted that the third and fourth approaches have $U_k$ in common. $F_k$, defined as $\phi(E_k)$, can be calculated recursively as $F_k=\phi(\Sigma(i \neq k)\phi(\beta_i))=\Sigma(i \neq k) \boxplus \beta_i$.

The BP operation can be represented as:

$$V_1 \boxplus V_2 = \alpha_1\alpha_2[\min(\beta_1, \beta_2) - \delta(\beta_1, \beta_2)] \quad (8)$$

The bias term in the BP operation (8) is $\delta(\beta_1, \beta_2)=\mu(\beta_1-\beta_2)-\mu(\beta_1+\beta_2)$, where the correction terms are defined as $\mu(x)=\ln(1+\exp(-|x|))$.

Figure 5:
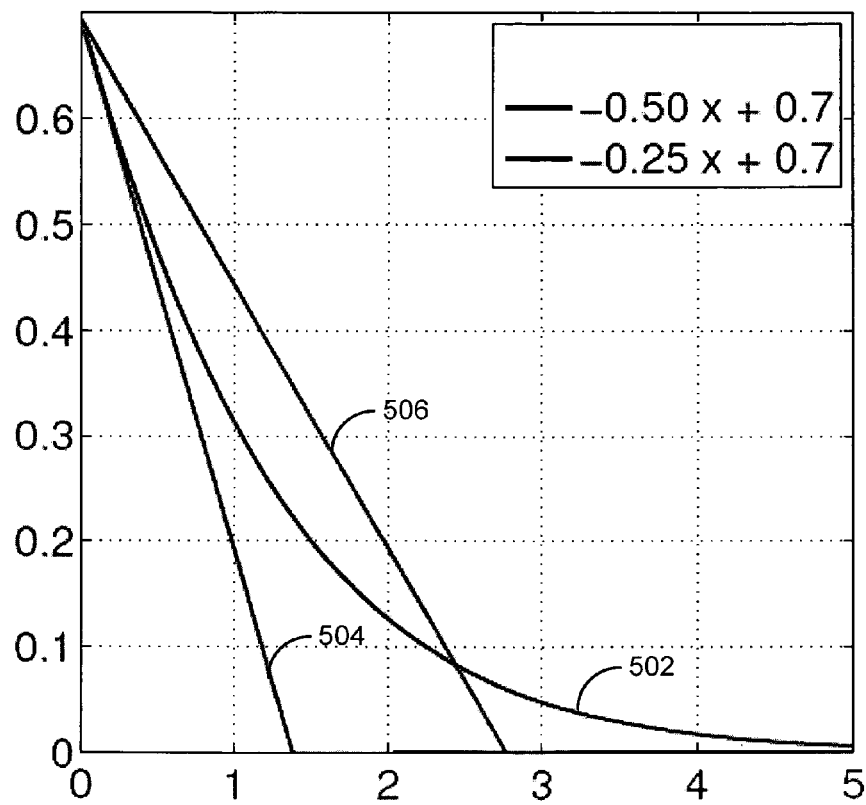
FIG. 5 depicts a graph of a BP correction function.

FIG. 5 depicts a graph 500 of a BP correction function. In the example of FIG. 5, $\mu(x)$ is depicted as curve 502. FIG. 5 is intended to show that $\mu(0)=\ln(2) \approx 0.7$, and $\lim(x \to \infty)\mu(x)=0$.

BPA can be implemented using a forward-backward algorithm. Backward recursion:

Begin
 $\lambda_{dc-1} = \beta_{dc}$
 for k = ($d_c$ - 2) : -1 : 1
  $\lambda_k = \lambda_{k+1} \boxplus \beta_{k+1}$
 end
End Forward recursion:

Begin
 $F_1 = \lambda_1$
 $\gamma_2 = \beta_1$
 for k = 3 : +1 : $d_c$
  $\gamma_k = \gamma_{k-1} \boxplus \beta_{k-1}$
  $F_{k-1} = \gamma_{k-1} \boxplus \lambda_{k-1}$
 end
 $F_{dc} = \gamma_{dc}$
End The backward recursion requires ($d_c$-2) BP operations. The forward recursion requires 2($d_c$-2) BP operations. One look-up table is needed to calculate the correction term. To calculate all $d_c$ extrinsic $F_k$, 3($d_c$-2) BP operations are required. Each operation finds the minimum of the two inputs, one subtraction for the argument to the first correction term, one addition for the argument to the second correction term, one subtraction to calculate the bias term, and one subtraction to remove the bias term.

The BP operations used in the BPA can be approximated by using the dominant term in the bias term $\delta(\beta_1,\beta_2)=\mu(\beta_1-\beta_2)-\mu(\beta_1+\beta_2) \approx \mu(\beta_1-\beta_2)$. With the approximated bias, the BP operation can be simplified to $\beta_1 \boxplus \beta_2 = \min(\beta_1, \beta_2) - \mu(\beta_1 - \beta_2) + \mu(\beta_1 + \beta_2) \approx \max(\min(\beta_1, \beta_2) - \mu(\beta_1 - \beta_2), 0)$, and the look-up table for $\mu$ is only needed once per BP operation. The maximization is needed to avoid negative values of $F_k^*$. This variant of the BPA is referred to in this paper as the simplified BPA (SBPA).

Another approach, referred to as the APP approach (APPA) is similar to the calculations of the APP L-values $P_n = L_n + \Sigma(m=1 \ldots M) C_{m,n} H_{m,n}$, $n=1, 2, \ldots, N$, that uses all check-node L-values. Instead of using the extrinsic values that disregard $\beta_k$ to calculate $F_k$, all $\beta_k$ can be used: $F_k \approx \Sigma(i=1 \ldots d_c) \boxplus \beta_i$, for all $k \geq 1$, where F is defined as $\phi(\Sigma(i=1 \ldots d_c)\phi(\beta_i))$. Note that $F = F_k \boxplus \beta_k$, for all $k \geq 1$, if $F_k$ is the true extrinsic L-value calculated as in $F_k = \phi(\Sigma(i \neq k)\phi(\beta_i)) = \Sigma(i \neq k) \boxplus \beta_1$. Note also that even if $F_k \approx F$ is identical for all k, $C_k$ will still depend on the signs $C_k \approx U_k F$, for all $k \geq 1$.

The techniques described with reference to the SBPA are also applicable to the APPA, and such an approach is referred to as a simplified APPA (SAPPA) in this paper.

$|\beta_i|$ can be ordered such that $\beta_1^* \leq \beta_2^* \leq \ldots \leq \beta_{dc}^*$. It follows from equation (6) that $\Sigma(i=1 \ldots d_c)\phi(\beta_i^*) \geq \Sigma(i=1 \ldots d_c-1)\phi(\beta_i^*) \geq \ldots \geq \phi(\beta_1^*) + (\beta_2^*) \geq \phi(\beta_1^*)$. Since $\phi(x+\epsilon) \leq \phi(x)$ for any $\epsilon \geq 0$ it follows that $\phi(\beta_{dc}^*) \leq \phi(\beta_{dc-1}^*) \leq \ldots \leq \phi(\beta_1^*)$. So $E_k^*$ can be defined as $\Sigma(i=1 \ldots k-1)\phi(\beta_i^*) + \Sigma(i=k+1 \ldots d_c)\phi(\beta_i^*)$. Note that $E_i$ is only equal to $E_k^*$ if $\beta_i = \beta_k^*$. Since $\phi(\beta_1^*)$ is the largest term, it can be concluded that $$E_1^* \leq E_2^* \leq \ldots \leq E_{dc}^*. \quad (9)$$

An upper bound to $E_k^*$ is to replace every term in $\Sigma(i=1 \ldots k-1)\phi(\beta_i^*) + \Sigma(i=k+1 \ldots d_c)\phi(\beta_i^*)$ with the largest term:

$$E_1^* \leq (d_c-1)\phi(\beta_2^*), \quad (10.1)$$

$$E_k^* \leq (d_c-1)\phi(\beta_1^*), \text{ for all } k \geq 2. \quad (10.2)$$

Another upper bound to $E_k^*$ is to add the missing term in $\Sigma(i=1 \ldots k-1)\phi(\beta_i^*) + \Sigma(i=k+1 \ldots d_c)\phi(\beta_i^*)$:

$$E_k^* \leq E_k^* + \phi(\beta_k^*) = \Sigma(i=1 \ldots d_c)\phi(\beta_i^*). \quad (11)$$

A lower bound to $E_k^*$ is to keep only the largest term in $\Sigma(i=1 \ldots k-1)\phi(\beta_i^*) + \Sigma(i=k+1 \ldots d_c)\phi(\beta_i^*)$:

$$E_1^* \geq \phi(\beta_2^*), \quad (12.1)$$

$$E_k^* \geq \phi(\beta_1^*), \text{ for all } k \geq 2. \quad (12.2)$$

Disregarding the last summation in $\Sigma(i=1 \ldots k-1)\phi(\beta_i^*) + \Sigma(i=k+1 \ldots d_c)\phi(\beta_i^*)$ gives a tighter lower bound to $E_k^*$ $$E_k^* \geq \Sigma(i=1 \ldots k-1)\phi(\beta_i^*), \text{ for all } k \geq 2. \quad (13)$$

Figure 6:
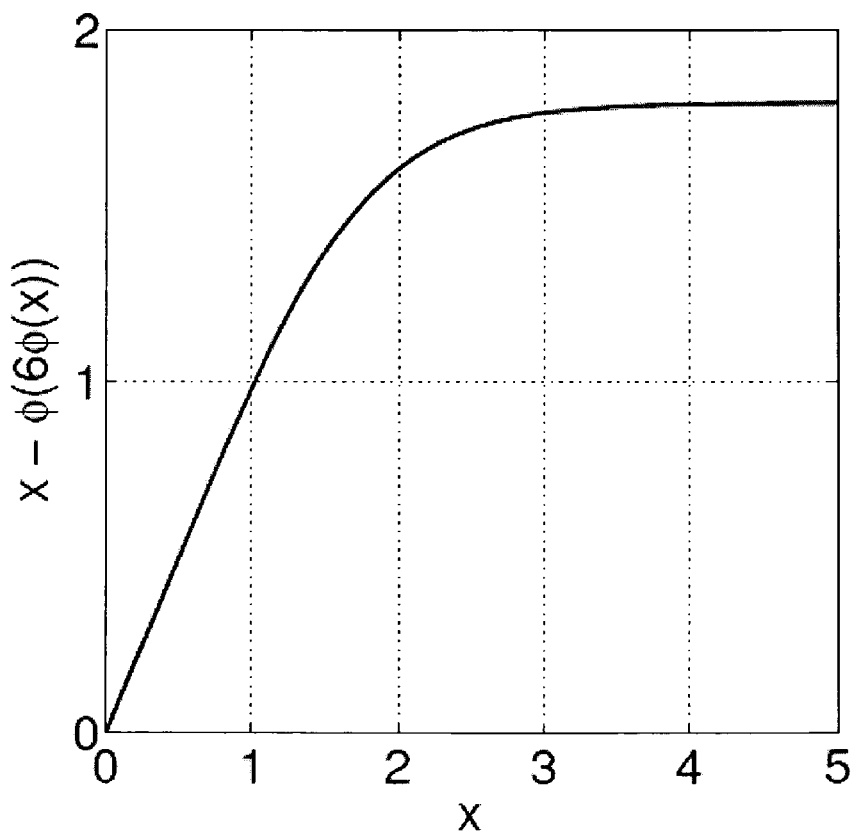
FIG. 6 depicts a graph of an upper bound on the bias when $d_c=7$.

It can be shown that $\lim_{x \to \infty}[x - \phi((d_c-1)\phi(x))] = \ln(d_c-1)$. FIG. 6 depicts a graph 600 of an upper bound on the bias when $d_c=7$. FIG. 6 is intended to show that the function converges to $\ln(d_c-1) = \ln(5.2) \approx 1.8$. Where $F_k$ is defined as $\phi(E_k)$, using equations (10) gives lower bounds to $F_k^*$:

$$F_1^* \geq \phi((d_c-1)\phi(\beta_2^*)) \geq \max(\beta_2^* - \ln(d_c-1), 0), \quad (14.1)$$

$$F_k^* \geq \phi((d_c-1)\phi(\beta_1^*)) \geq \max(\beta_1^* - \ln(d_c-1), 0), \text{ for all } k \geq 2. \quad (14.2)$$

Figure 7:
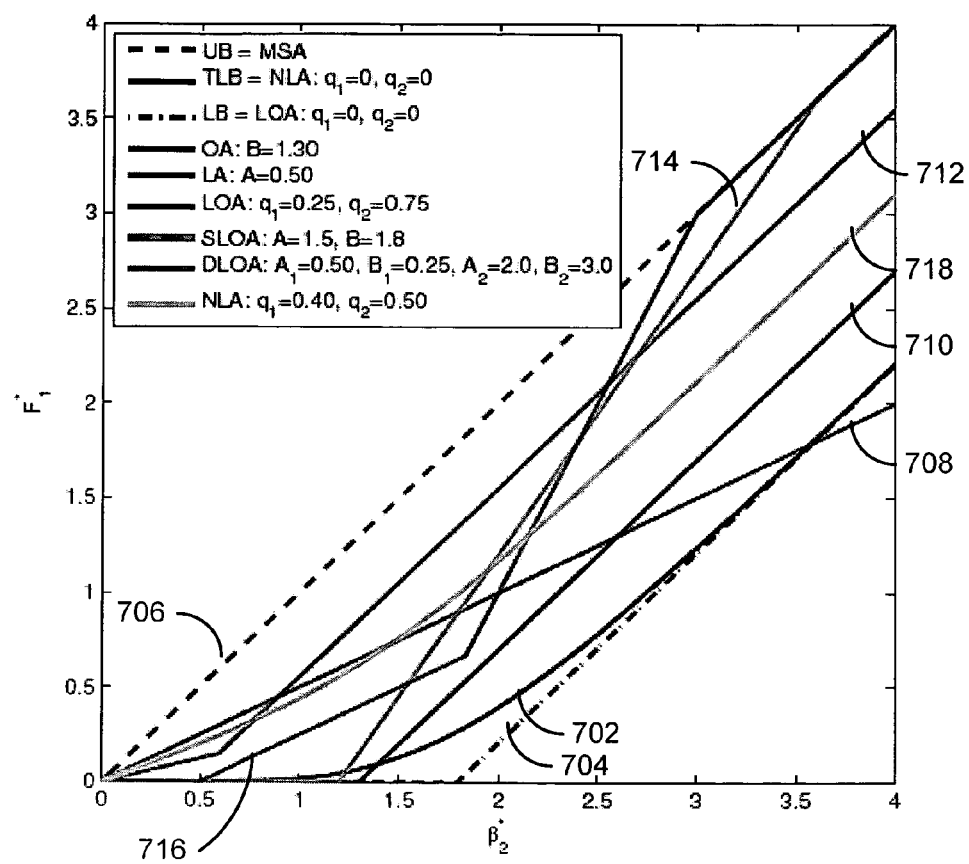
FIG. 7 depicts a graph of an upper and lower bound to $F_1^*$ and different approximations when $d_c=7$.

FIG. 7 depicts a graph 700 of an upper and lower bound to $F_1^*$ and different approximations when $d_c=7$. The tight lower bound (TLB) and the lower bound (LB) for $F_1^*$ in (14.1) are depicted in FIG. 7 as the solid curve 702 and the dashed-dotted curve 704, respectively.

Where $F_k$ is defined as $\phi(E_k)$, (11) gives another lower bound to $F_k^*$:

$$F_k^* \geq \phi(\Sigma(i=1 \ldots d_c)\phi(\beta_i^*)). \quad (15)$$

A tighter lower bound is to always choose the larger of the two lower bounds $F_1^* \geq \max[\phi((d_c-1)\phi(\beta_2^*)), \phi(\Sigma(i=1 \ldots d_c)\phi(\beta_i^*))]$ and $F_k^* \geq \max[\phi((d_c-1)\phi(\beta_1^*)), \phi(\Sigma(i=1 \ldots d_c)\phi(\beta_i^*))]$, for all $k \geq 2$.

Where $F_k$ is defined as $\phi(E_k)$, since $\phi$ is self-invertible (7), combining equations (12) and (13) gives upper bounds to $F_k^*$:

$$F_1^* \leq \phi(\phi(\beta_2^*)) = \beta_2^*, \quad (16.1)$$

$$F_k^* \leq \phi(\Sigma(i=1 \ldots k-1)\phi(\beta_i^*)) \leq \phi(\phi(\beta_1^*)) = \beta_1^*, \text{ for all } k \geq 2, \quad (16.2)$$

$$F_k^* \leq \phi(\Sigma(i=1 \ldots Q, i \neq k)\phi(\beta_i^*)), \text{ for all } 2 \leq Q \leq d_c \text{ and } k \geq 2, \quad (17)$$

The upper bound (UB) for $F_1^*$ in (16.1) is shown in FIG. 7 as the black dashed curve 706.

Where $F_k$ is defined as $\phi(E_k)$, combining (9) and (15) gives $F_1^* \geq F_2^* \geq \ldots \geq F_{dc}^* \geq \phi(\Sigma(i=1 \ldots d_c)\phi(\beta_i^*))$. It follows from equation (8) that the lower bound to $F_k^*$ can therefore be rewritten as $F_k^* \geq F_{k+1}^* \geq \Sigma(i=1 \ldots d_c) \boxplus \beta_i^* = F_j^* \boxplus \beta_j^*$, for all $1 \leq k \leq d_c-1$ and $1 \geq j \geq d_c$. In a similar way, the upper bound to $F_k^*$ in equations (16), (17) can be written as $F_1^* \leq \beta_2^* \leq \ldots \leq \beta_{dc}^*$; $F_k^* \leq \Sigma(i=1 \ldots k-1) \boxplus \beta_i^* \leq \beta_1^* \leq \ldots \leq \beta_{dc}^*$, for all $k \geq 2$; $F_k^* \leq \Sigma(i=1 \ldots Q, i \neq k) \boxplus \beta_i^*$, for all $2 \leq Q \leq d_c$ and $k \geq 2$.

Due to the complexities of the four approaches described above with reference to equation (5), it is considered desirable in practice to replace equation (5) with an equation that provides similar results with fewer and/or less complex calculations. The min-sum approximation (MSA) can be used to approximate $F_k^*$ using the simple upper bounds $F_1^* \leq \beta_2^* \leq \ldots \leq \beta_{dc}^*$; $F_k^* \leq \Sigma(i=1 \ldots k-1) \boxplus \beta_i^* \leq \beta_1^* \leq \ldots \leq \beta_{dc}^*$, for all $k \geq 2$; $F_k^* \leq \Sigma(i=1 \ldots Q, i \neq k) \boxplus \beta_i^*$, for all $2 \leq Q \leq d_c$ and $k \geq 2$, where the approximation is equal to the minimum $\beta_j$, $F_1^* \approx \beta_2^*$, $F_k^* \approx \beta_1^*$, for all $k \geq 2$. This can also be expressed as $F_k \approx \beta_2^*$, if $\beta_k = \beta_1^*$, $\beta_1^*$ otherwise, from which it can be seen that the check node needs to find the two smallest $\beta_j$ to update all $d_c$ extrinsic L-values. By definition, this approximation is always over-estimating $F_k$. MSA is equal to the upper bounds in equations (16) and is shown for $F_1^*$ in FIG. 7 as the black dashed curve 706.

A linear approximation (LA) entails using a fixed attenuation, A. $F_1^* \approx A\beta_2^*$, $F_k^* \approx A_{=1}^*$, for all $k \geq 2$. From (16.1) and 16.2), it follows that the attenuation should be chosen in the interval $0 < A \leq 1$. A disadvantage of the LA approach is that whichever A is chosen, there will be a range of $\beta_1^*$ where $F_k^* \approx A\beta_1^*$ is below its lower bound $\beta_1^* - \ln(d_c-1)$. If $A=1$, the LA approach is equivalent to MSA. The LA for $F_1^*$ using $A=0.50$ is shown in FIG. 7 as the curve 708. In this example, FIG. 7 is intended to show that LA will be below the TLB 702 (and the LB 704) for large $\beta_2^*$. It has been shown that LA with a fixed attenuation (properly optimized) for all iterations can be good for regular LDPC codes. However, a fixed attenuation used in all iterations tends to give an error floor for irregular LDPC codes.

The greater the number of iterations, the greater the reliability of L-values from the variable nodes $V_k$ used in the check node update. When $\beta_1^*$ becomes larger, the approximation of $F_k^*$ changes. Advantageously, a dependency on the iteration number to the parameters used in the approximations, A, B, $q_1$, and $q_2$, can be provided. Note that the bounds for $F_k^*$ are still independent of iterations. Note also that some of the above-mentioned check node update approaches, for example, SPA, BPA, and MSA have no parameters and are identical for each iteration.

Irregular LDPC codes with an attenuation that varies with the iterations (properly optimized) can remove the error floor and be almost as good as a non-linear approximation (properly optimized). Usually the attenuation is growing with iterations such that $A^{(i)} \geq A^{(i-1)}$. An ad hoc approach is to switch between MSA and LA. Let $A^{(i)}$ denote the attenuation at iteration, i. This can be referred to as a non-constant parameter approach (NCPA). For example, $A^{(i)} \approx A$ if mod(i, I)=0 (LA), 1 otherwise (MSA). For example, I=3 and A=0.7 give the sequence A=[0.7, 0.7, 1.0, 0.7, 0.7, 1.0, . . . , 0.7, 0.7, 1.0].

Figure 8:
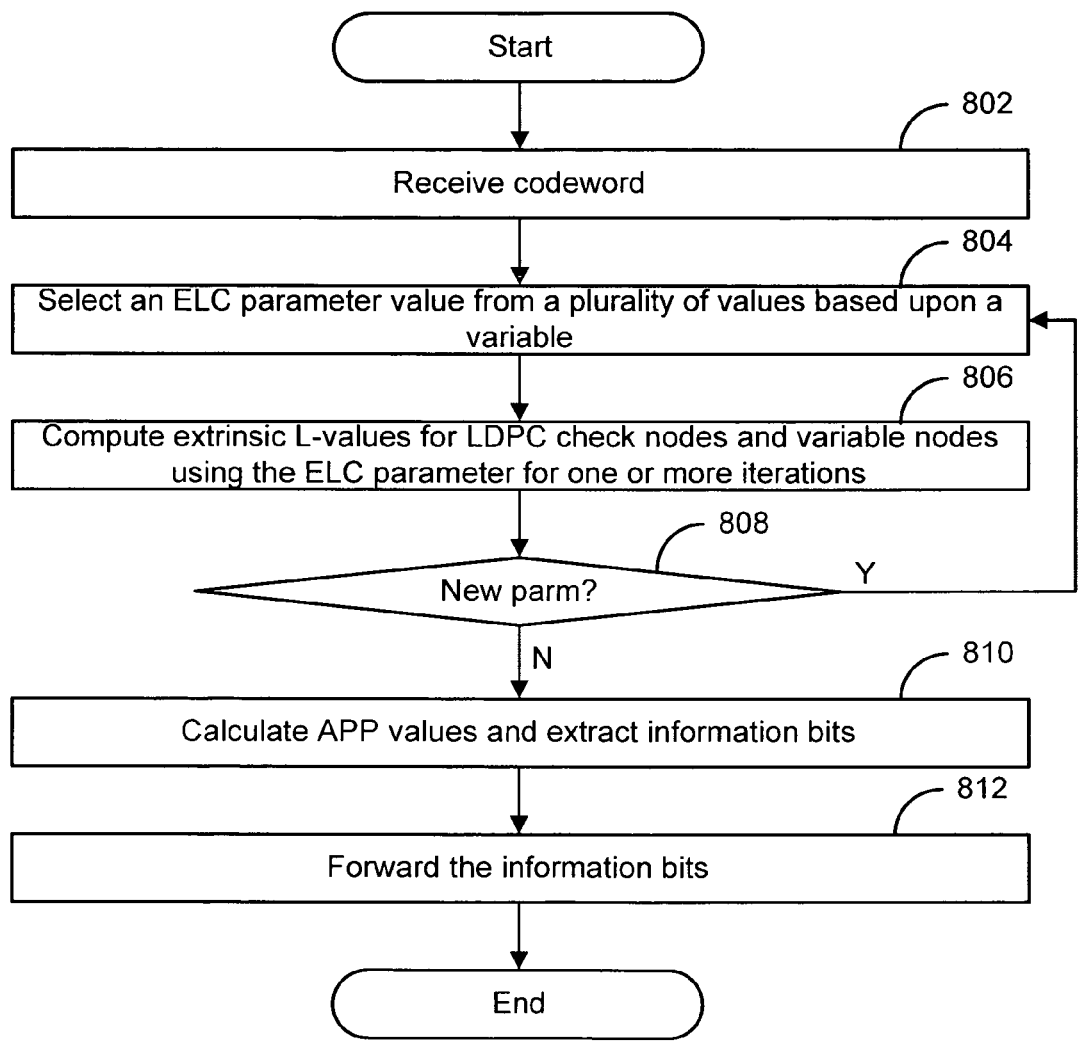
FIG. 8 depicts a flowchart of an example of a method for implementing a NCPA.

FIG. 8 depicts a flowchart 800 of an example of a method for implementing a NCPA. The method could be used with a system similar to that depicted by way of example in FIG. 1. This method and other methods are depicted as serially arranged modules. However, modules of the methods may be reordered, or arranged for parallel execution as appropriate. This and other methods described in this paper can be implemented on machines such as those described by way of example with reference to other figures.

In the example of FIG. 8, the flowchart 800 starts at module 802 with receiving a codeword. Channel L-values, $L_n$, for the codeword can be calculated in advance by, e.g., a constellation demapper, for storage in a buffer. The codeword can have variable length, though the variability may be subject to limitations based upon the implementation and/or configuration, which could include requiring codewords of a certain length, requiring codewords not exceed a maximum length, or the like. There may be an initialization stage, where the check node L-values $C_{m,n}$ are reset to zero and APP L-values, $P_n$, are initialized with the channel L-values, $L_n$.

In the example of FIG. 8, the flowchart 800 continues to module 804 with selecting an extrinsic L-value computation (ELC) parameter from a plurality of values based upon a variable. The ELC parameter can be a node limiting approximation parameter, Q, a check node bounding parameter, A, B, or $q_n$, or some other appropriate parameter. The values appropriate for a particular parameter will depend upon the variable itself, circumstances, implementation, configuration, or the like. Multiple ELC parameter values can be selected at module 804, depending upon the variable itself, circumstances, implementation, configuration, or the like.

Variables can include the current iteration of a number of iterations in a computation, $d_c$, characteristics of the check node, or some other factor. For example, the variable could be an iteration counter, i. For such a variable, it may be desirable to initialize it to a starting value and perhaps also to set an iteration threshold, I, that causes the variable to trigger periodically, (pseudo-)randomly, or with some other frequency or consistency. The iteration threshold, in this example, could be set once and reused over time, or it could itself be subject to variation based upon changed conditions. One possible triggering mechanism could be a function that takes the variable as input and either selects or causes the selection of the ELC parameter value. With reference once again to the iteration counter example, the triggering mechanism could be a mod function that takes i and I as input: mod(i, I).

In the example of FIG. 8, the flowchart 800 continues to module 806 with computing extrinsic L-values for LDPC check nodes using the ELC parameter for one or more iterations. Computations can include those used when implementing an LA, OA, NLA, using a linear and/or approximated BPA, APPA, or variants thereof, and the like. There are typically many such computations. If the ELC parameter value will not be selected again (e.g., because it can only be selected a certain number of times and that has been met, it is on an iteration for which there are no additional parameter value changes forthcoming, etc.), all remaining computations will be completed in module 806.

In the example of FIG. 8, the flowchart 800 continues to decision point 808 with determining whether there is a new ELC parameter value. If it is determined that there is a new ELC parameter value (808-Y), then the flowchart 800 returns to module 804 and continues as described previously.

If, on the other hand, it is determined that there are no additional iterations (808-N), then the flowchart 800 continues to module 810 with calculating APP values and extracting information bits. The logic of the flowchart 800 in this example requires that if there are no additional iterations to be performed, there is by definition no new ELC parameter (808-N). It may be noted that there may be no actual "determination" at decision point 808, but it rather could be that a function that provides the ELC parameter values updates automatically. For example, if the parameter value changes at iteration, i, the parameter could simply be updated without a determination as to whether a new parameter value is needed.

In the example of FIG. 8, the flowchart 800 ends at module 812 with forwarding the data. Of course, the method can be repeated for subsequently received codewords.

Advantageously, an offset approximation (OA) uses a fixed bias, B, as opposed to over-estimating $F_k$ as with MSA, or using a fixed attenuation, A, as with LA.

$$F_1^* \approx \max(\beta_2^* - B, 0), \tag{18.1}$$

$$F_k^* \approx \max(\beta_1^* - B, 0), \text{ for all } k \geq 2. \tag{18.2}$$

From (14.1) and (14.2) it follows that the bias should be chosen in the interval $0 \leq B \leq \ln(d_c - 1)$. It may be noted that if B=0, the OA reduces to the MSA. The OA for $F_1^*$ using B=1.30 is shown in FIG. 7 as the curve 710. FIG. 7 is intended to show that OA is below the TLB 702 for small $\beta_2^*$.

Linear OA (LOA) combines OA and LA to use the larger of the two methods. $F_1^* \approx \max(A\beta_2^*, \beta_2^* - B)$, $F_k^* \approx \max(A\beta_1^*, \beta_1^* - B)$, for all other $k \geq 2$. Since there are intervals of A and B, this can be written as $$F_1^* \approx \max(q_1 \beta_2^*, \beta_2^* - (1-q_2) \ln(d_c - 1)), \tag{19.1}$$

$$F_k^* \approx \max(q_1 \beta_1^*, \beta_1^* - (1-q_2) \ln(d_c - 1)), \text{ for all } k \geq 2, \tag{19.2}$$

where $0 \leq q_1 < 1$ and $0 \leq q_2 \leq 1$ are design parameters. $q_1$ specifies the attenuation for small $\beta_1^*$ (and $\beta_2^*$) and $q_2$ specifies how far $F_k^*$ is from the lower bound for large $\beta_1^*$ (and $\beta_2^*$). Some examples of $q_1$ and $q_2$ for $k \geq 2$ are: $F_k^* \approx \max(0, \beta_1^* - (1-q_2) \ln(d_c - 1))$, for $q_1 = 0$ (OA); $F_k^* \approx \max(q_1 \beta_1^*, \beta_1^* - \ln(d_c - 1))$, for $q_2 = 0$ (LA with bound); $F_k^* \approx \max(0, \beta_1^* - \ln(d_c - 1))$, for $q_1 = 0$, $q_2 = 0$ (OA with max basis); $F_k^* \approx \max(\beta_1^*, \beta_1^* - (1-q_2) \ln(d_c - 1)) = \beta_1^*$, for $q_1 = 1$ (MSA); $F_k^* \approx \max(q_1 \beta_1^*, \beta_1^*) = \beta_1^*$, for $q_2 = 1$ (MSA).

The LOA for $F_1^*$ using $q_1 = 0$ and $q_2 = 0$ is the lower bound (14.1) and shown in FIG. 7 as the black dashed-dotted curve 704. The LOA for $F_1^*$ using $q_1 = 0.25$ and $q_2 = 0.75$ is shown in FIG. 7 as the curve 712. FIG. 7 is intended to show that LOA can be within its UB 706 and TLB 702 for all $\beta_2^*$ if $q_1$ and $q_2$ are chosen properly.

As an example of an NCPA for LOA depending on $d_c$ and/or k, $$F_1^* \approx \max(A_1 \beta_2^*, \beta_2^* - B_1 \ln(d_c - 1)), \tag{20.1}$$

$$F_k^* \approx \max(A_2 \beta_1^*, \beta_1^* - B_2 \ln(d_c - 1)), \text{ for all } k \geq 2. \tag{20.2}$$

Single linear OA (SLOA) uses one linear curve including the upper and lower bound.

$$F_1^* \approx \max(\min(A\beta_2^* - B, \beta_2^*), 0), \tag{21.1}$$

$$F_k^* \approx \max(\min(A\beta_1^* - B, \beta_1^*), 0), \text{ for all } k \geq 2. \tag{21.2}$$

In this case, A can be larger than 1.0. The SLOA for $F_1^*$ using A=1.5 and B=1.8 is shown in FIG. 7 as the curve 714. FIG. 7 is intended to show that SLOA is below its TLB 702 for small $\beta_2^*$.

Double linear OA (DLOA) uses two linear curves including the upper and lower bound.

$$F_1^* \approx \max(\min(\max(A_1\beta_2^*-B_1, A_2\beta_2^*-B_2), \beta_2^*), 0), \quad (22.1)$$

$$F_k^* \approx \max(\min(A_1\beta_1^*-B_1, A_2\beta_1^*-B_2), \beta_1^*), 0), \text{ for all } k \geq 2. \quad (22.2)$$

OA, LOA, and SLOA are special cases of DLOA. DLOA can also be reduced to LA and MSA. The DLOA for $F_1^*$ using $A_1=0.5$, $B_1=0.25$, $A_2=2.0$, and $B_2=3.0$ is shown in FIG. 7 as the curve 716. FIG. 7 is intended to show that DLOA can be within its UB 706 and TLB 702 for all $\beta_2^*$ if the parameters are chosen properly.

Figure 9:
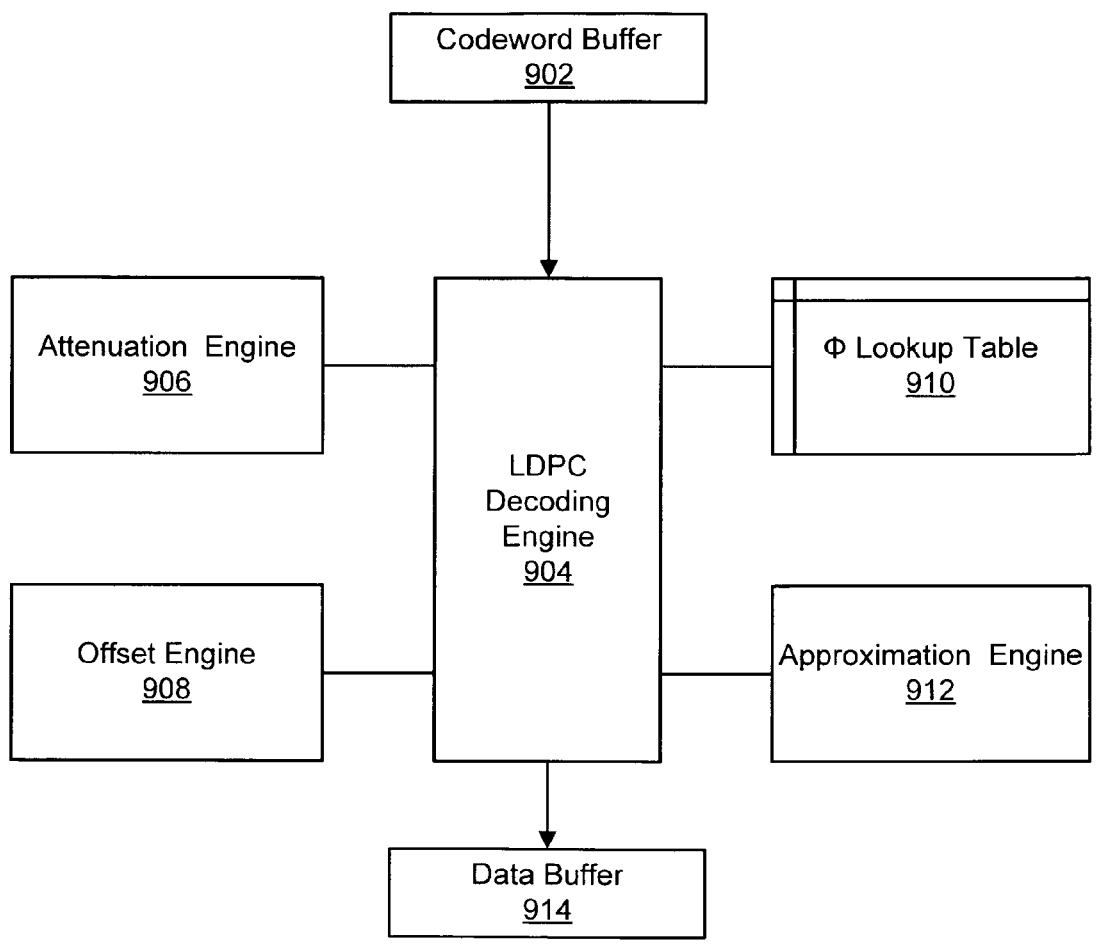
FIG. 9 depicts an example of a LC LDPC decoder.

FIG. 9 depicts an example of a LC LDPC decoder 900. The LDPC decoder 900 includes a codeword buffer 902, a LDPC decoding engine 904, an attenuation engine 906, an offset engine 908, a φ lookup table 910, an approximation engine 912, and a data buffer 914.

In operation, the codeword buffer 902 contains at least a subset of a codeword. It may be noted that a known or convenient computer-readable storage medium could be used, regardless of whether it is referred to as a "buffer." In at least some implementations, the entire codeword is contained in the codeword buffer 902 prior to demodulation by the decoding engine 904.

The LDPC decoding engine 904 performs operations to obtain data bits from the codeword contained in the codeword buffer 902. Depending upon the implementation, configuration, and/or embodiment, the LDPC decoding engine 904 can implement one of OA, LOA, SLOA, DLOA, NLA, LBPA, SLBPA, LAPPA, SLAPPA, BPA-APPA, SBPA-SAPPA, LBPA-LAPPA, SLBPA-SLAPPA, ASPA, ABPA, ASBPA, ALBPA, ASLBPA, AAPPA, ASAPPA, ALAPPA, ASLAPPA, MSA-AAPPA, MSA-ASAPPA, MSA-ALAPPA, MSA-ASLAPPA, combinations, variations, and other applicable approaches and approximations. If the LDPC decoding engine 904 is capable of a specific approach or approximation, it can be referred to as, for example, an OA LDPC decoding engine. Where the LDPC decoding engine 904 is capable of switching between approaches and approximations, the LDPC decoding engine 904 can be referred to as an approach-configurable LDPC decoding engine.

The attenuation engine 906 can provide an attenuation parameter, A, to the decoding engine 904 that is useful in bounding the operations. The attenuation engine 906 can either be provided the value of A or generate the attenuation parameter using rules based upon operational variables. The attenuation engine 906 may or may not be able to modify the value of A, depending upon the implementation. The attenuation parameter, A, can be used by the decoding engine 904 to perform a LA on the codeword. If a NCPA is used, A can vary depending upon, for example, the iteration, $d_c$, the check node, or some other factor. Depending upon the implementation and/or configuration, the attenuation engine 906 can provide multiple attenuation parameters, e.g., $A_1$ and $A_2$ and/or intervals of A, e.g., $q_1$. It should be noted that the attenuation engine 906 could be implemented as "part of" the LDPC decoding engine 904, and the two components could be referred to together as an attenuation-sensitive LDPC decoding engine.

The offset engine 908 can provide a bias parameter, B, to the decoding engine 904 that is useful in bounding the operations. The offset engine 908 can either be provided the value of B or generate the bias parameter using rules based upon operational variables. The offset engine 908 may or may not be able to modify the value of B, depending upon the implementation. The bias parameter, B, can be used by the decoding engine 904 to perform an OA on the codeword. If a NCPA is used, B can vary depending upon, for example, the iteration, $d_c$, the check node, or some other factor. Depending upon the implementation and/or configuration, the offset engine 908 can provide multiple bias parameters, e.g., $B_1$ and $B_2$ and/or intervals of B, e.g., $q_2$. It should be noted that the offset engine 908 could be implemented as "part of" the LDPC decoding engine 904, and the two components could be referred to together as an offset-sensitive LDPC decoding engine.

The φ lookup table 910 includes multiple values of φ. If the decoding engine 904 needs to know the value of φ, using a lookup table is a common technique for providing the values. The decoding engine 904 includes an interface for the φ lookup table 910, to the extent a given implementation requires such an interface.

The approximation engine 912 can provide an approximation parameter, Q, to the decoding engine 904 that is useful in reducing the amount of processing required for the decoding engine 904. If a NCPA is used, Q, can vary depending upon, for example, the iteration, $d_c$, the check node, or some other factor. It should be noted that the approximation engine 906 could be implemented as "part of" the LDPC decoding engine 904, and the two components could be referred to together as a node-limiting LDPC decoding engine.

The LDPC decoding engine 904 puts data bits associated with the decoded codeword in the data buffer 914.

Figure 10:
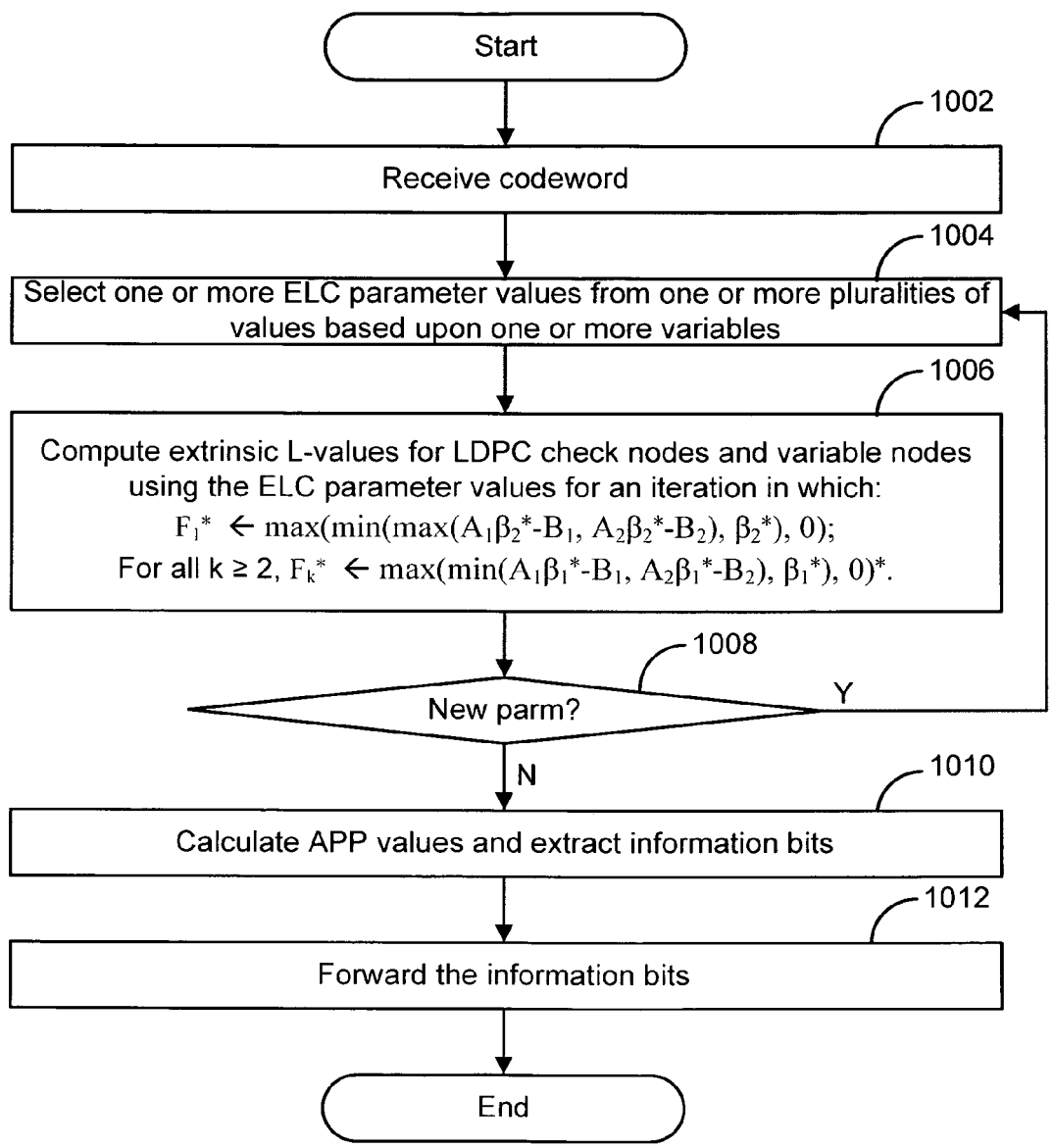
FIG. 10 depicts a flowchart of an example of a method for double linear offset approximation (DLOA).

FIG. 10 depicts a flowchart 1000 of an example of a method for DLOA. The method can be implemented, for example, in a system such as is depicted in FIGS. 1, 3, and/or 9. In the example of FIG. 10, the flowchart 1000 starts at module 1002 with receiving a codeword.

In the example of FIG. 10, the flowchart 1000 continues to module 1004 with selecting one or more ELC parameter values from one or more pluralities of values based upon one or more variables. In this example, the ELC parameter values are one or more of $A_1$, $B_1$, $A_2$, $B_2$, though one or more of these values could be preset. By choosing appropriate values, the method can be simplified to act as MSA, LA, OA, LOA, or SLOA, rather than DLOA, which is the most general example. The values appropriate for a particular parameter will depend upon the variable itself, circumstances, implementation, configuration, or the like. Multiple ELC parameter values can be selected at module 1004, depending upon the variable itself, circumstances, implementation, configuration, or the like.

In the example of FIG. 10, the flowchart 1000 continues to module 1006 with computing extrinsic L-values for LDPC check nodes and variable nodes using the ELC parameter values for an iteration in which: $F_1^*$ has the value $\max(\min(\max(A_1\beta_2^*-B_1, A_2\beta_2^*-B_2), \beta_2^*), 0)$; and, for all $k \geq 2$, setting $F_k^*$ has the value $\max(\min(A_1\beta_1^*-B_1, A_2\beta_1^*-B_2), \beta_1^*), 0)$.

In the example of FIG. 10, the flowchart 1000 continues to decision point 1008 with determining whether there is a new ELC parameter value. If it is determined that there is a new ELC parameter value (1008-Y), then the flowchart 1000 returns to module 1004 and continues as described previously.

If, on the other hand, it is determined that there are no additional iterations (1008-N), then the flowchart 1000 continues to module 1010 with calculating APP values and extracting information bits. The logic of the flowchart 1000 in this example requires that if there are no additional iterations to be performed, there is by definition no new ELC parameter (1008-N). It may be noted that there may be no actual "determination" at decision point 1008, but it rather could be that a function that provides the ELC parameter values updates automatically. For example, if the parameter value changes at iteration, i, the parameter could simply be updated without a determination as to whether a new parameter value is needed.

In the example of FIG. 10, the flowchart 1000 ends at module 1012 with forwarding the data. Of course, the method can be repeated for subsequently received codewords.

Non-linear approximation (NLA) uses a weighted sum of the upper and lower bound using equations (14), as specified in (16.1) and (16.2).

$$F_1^* \approx (1-q_1)\phi((1+(d_c-2)q_3)\phi(\beta_2^*))+q_1\beta_2^*, \quad (23.1)$$

$$F_k^* \approx (1-q_1)\phi((1+(d_c-2)q_3)\phi(\beta_1^*))+q_1\beta_1^*, \text{ for all } k\geq 2, \quad (23.2)$$

where $0 \leq q_1 \leq 1$ and $0 \leq q_3 \leq 1$ are design parameters that assure that the approximation is within its upper and lower bound. As with LOA, $q_1$ specifies the attenuation for small $\beta_1^*$. If $q_3$ is defined as $[(d_c-1)^{(1-q_2/(1-q_1))}-1](d_c-2)^{-1}$, NLA will be similar to LOA for large $\beta_1^*$ if they are using the same $q_1$ and $q_3$. Some examples of $q_1$ and $q_2$ for $k \geq 2$ are: $F_k^* \approx \phi((1+(d_c-2)q_3)\phi(\beta_1^*))$, for $q_1=0$ (non-linear bias); $F_k^* \approx \phi((d_c-1)\phi(\beta_1^*))$, for $q_1=0$, $q_2=0$ (tight lower bound); $F_k^* \approx (1-q_1)\phi((d_c-1)\phi(\beta_1^*))+q_1\beta_1^*$, for $q_1=q_2$ (weighted bounds); $F_k^* \approx \beta_1^*$, for $q_1=1$ (MSA); $F_k^* \approx (1-q_1)\phi(\phi(\beta_1^*))+q_1\beta_1^*=\beta_1^*$ for $q_2=1$ (MSA).

The NLA for $F_1^*$ using $q_1=0$ and $q_2=0$ is the tight lower bound in (14.1) and shown in FIG. 7 as TLB 702. The NLA for $F_1^*$ using $q_1=0.40$ and $q_2=0.50$ is shown in FIG. 7 as the curve 718. FIG. 7 is intended to show that NLA falls within TLB 702 and UB 706 for all $\beta_2^*$ if the parameters are chosen properly. Convenient variations of the specific NLA provided here can also be used.

Figure 11:
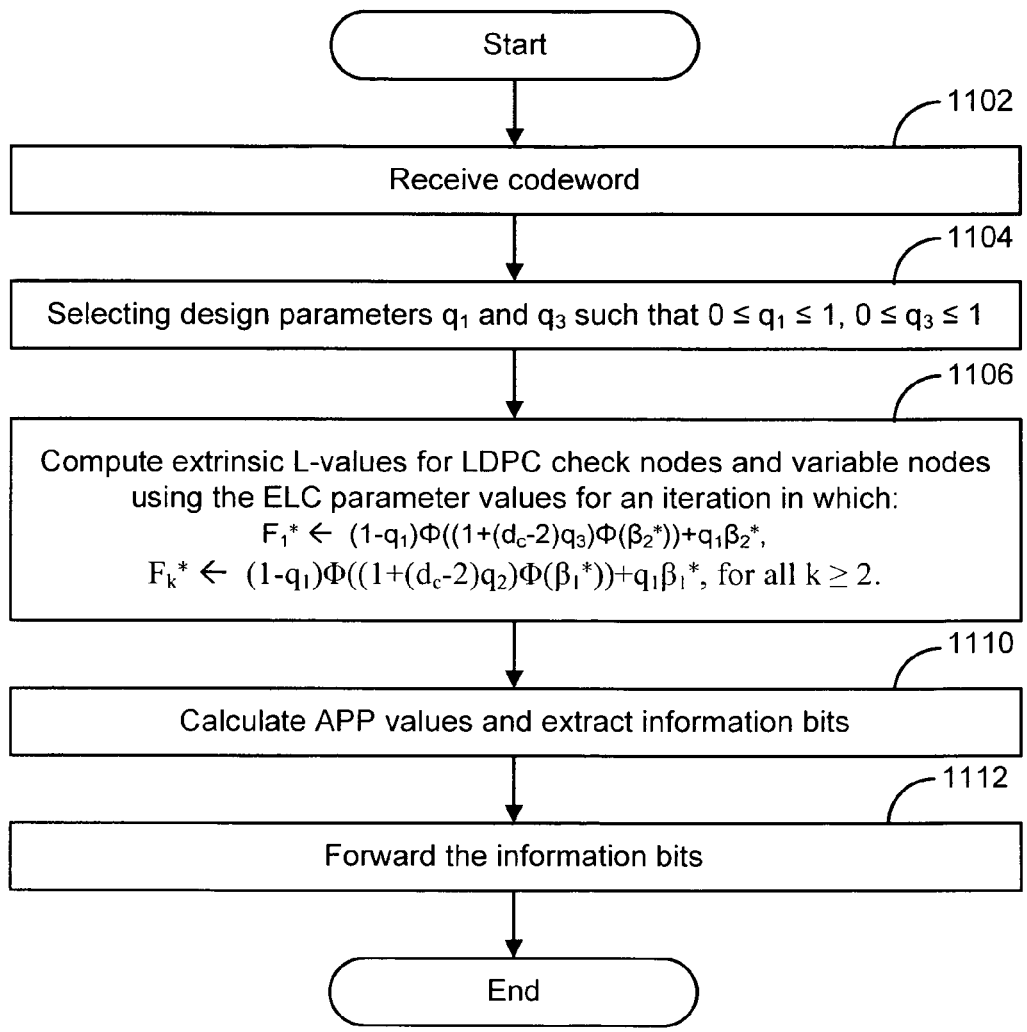
FIG. 11 depicts a flowchart of an example of a method for non-linear approximation (NLA).

FIG. 11 depicts a flowchart 1100 of an example of a method for NLA. The method can be implemented, for example, in a system such as is depicted in FIGS. 1, 3, and/or 9. In the example of FIG. 11, the flowchart 1100 starts at module 1102 with receiving a codeword.

In the example of FIG. 11, the flowchart 1100 continues to module 1104 with selecting design parameters $q_1$ and $q_3$. The values appropriate for a particular parameter can depend upon the variable itself, circumstances, implementation, configuration, or the like.

In the example of FIG. 11, the flowchart 1100 continues to module 1106 with computing extrinsic L-values for LDPC check nodes and variable nodes using the ELC parameter values for an iteration in which $F_1^* \leftarrow (1-q_1)\phi((1+(d_c-2)q_3)\phi(\beta_2^*))+q_1\beta_2^*$, and $F_k^* \leftarrow (1-q_1)\phi((1+(d_c-2)q_3)\phi(\beta_1^*))+q_1\beta_1^*$, for all $k \geq 2$. The same or different design parameters can be used for successive iterations (not shown, but see, e.g., FIG. 8 or FIG. 10).

In the example of FIG. 11, the flowchart 1100 continues to module 1110 with calculating APP values and extracting information bits. In the example of FIG. 11, the flowchart 1100 ends at module 1112 with forwarding the information bits. Of course, the method can be repeated for subsequently received codewords.

Table 1 illustrates the relative complexity of MSA, LA, the OA variants, and NLA. The table lists the number of different operations required to decode one row in H. For one iteration these numbers need to be multiplied with M=ZS. However, Z of them will be performed in parallel. In Table 1, PAR lists the parameters used in the algorithm; FIND is the number of smallest $\beta_k$ that has to be found out of the $d_c$ edges connected to the check node; MIN is the number of two-input min or max operations (min or max operations with one input equal to zero are disregarded); LUT is the number of times a look-up table is needed; ADD is the number of additions/subtractions; MULT is the number of multiplications. Note that by choosing the scaling to $A \in \{2^{-j}, 1-2^{-j}\}$, for $j=0, 1, 2, \ldots$ simplifies the multiplications significantly.

TABLE 1

Relative Complexity of MSA, LA, OA variants, and NLA

| | PAR | FIND | MIN | LUT | ADD | MULT |
|---|---|---|---|---|---|---|
| MSA | — | — | 2 | — | — | — |
| LA | A | — | 2 | — | — | 2 |
| OA | B | — | 2 | — | 2 | — |
| LOA | A, B | 2 | 2 | — | 2 | 2 |
| SLOA | A, B | 2 | 2 | — | 2 | 2 |
| DLOA | $A_1, B_1, A_2, B_2$ | 2 | 4 | — | 4 | 4 |
| NLA | $q_1, q_2$ | 2 | — | 4 | 2 | 6 |

Advantageously, with linear BPA (LBPA), the BP operation can be approximated by using the dominant bias term approximated with a linear function: $\mu(x)=\max(B-A|x|,0)$, where $A>0$ and $B>0$ are design parameters. FIG. 5 shows a graph of the correction function (curve 502) together with the linear approximation using $A=0.25$, $B=0.7$ (curve 506), and $A=0.50$, $B=0.7$ (curve 504). With the linear approximation of the bias term the BP operation becomes $\beta_1 \boxplus \beta_2 \approx \max(\min(\beta_1, \beta_2)-\max(B-A|\beta_1-\beta_2|, 0)+\max(B-A((\beta_1-\beta_2), 0))$. If the two inputs are ordered, the operation simplifies to $\beta_1^* \boxplus \beta_2^* \approx \max(\beta_1^*-\max(B-A(\beta_2^*-\beta_1^*),0)+\max(B-A(\beta_2^*+\beta_1^*),0))$.

Where the SBPA and LBPA are known, the simplified LBPA (SLBPA), can be obtained by combining the techniques. The BP operation can be approximated using the dominant bias term approximated with a linear function $\beta_1 \boxplus \beta_2 \approx \max(\min(\beta_1,\beta_2)-\max(B-A|\beta_1-\beta_2|,0))$. If the two inputs are ordered the operation simplifies to $\beta_1^* \boxplus \beta_2^* \approx \max(\beta_1^*-\max(B-A(\beta_2^*-\beta_1^*),0))$.

Any of the approximations described earlier in SBPA, LBPA, and SLBPA can be used as the BP operation in the APPA. These approaches will then be referred to as SAPPA, LAPPA, and SLAPPA, respectively.

Instead of calculating the true extrinsic L-values for all check nodes (as in BPA), the extrinsic value for the least reliable check node can be calculated. The least reliable check node is the check node with the smallest $\beta_k$, i.e., check node $F_1^*$. The other check nodes can be under-estimated using the lower bound as with APPA described earlier: $F_1^*=\Sigma(i=2 \ldots d_c) \boxplus \beta_i^*$, $F_k^* \approx F_1^* \boxplus \beta_1^*$, for all $k \geq 2$. This is a combination of BPA and APPA, here denoted by BPA-APPA. The number of BP operations in BPA-APPA is reduced from $3(d_c-2)$ in the full BPA to $d_c-1$. The BPA-APPA can be described by the following procedure, where $\beta_i^*$ is found at the same time as $F_1^*$ is calculated:

```
Begin
    if(β₁ < β₂)
        F' = β₂
        λ = β₁
        j=1
    else
        F' = β₁
        λ = β₂
        j=2
    end
    for k=3:d_c
        if(β_k < λ)
            F' = F' ⊞ λ
            λ = β_k
            j=k
        else
```

-continued

```
        F' = F'⊞ β_k
    end
end
F_j=F'
F' = F'⊞ λ
F_k=F', for all k≠j
End
```

Any of the approximations described earlier in SBPA, LBPA, and SLBPA can be used as the BP operation in the BPA-APPA. These approaches will then be referred to as SBPA-SAPPA, LBPA-LAPPA, and SLBPA-SLAPPA, respectively.

Table 2 illustrates the relative complexity of SPA/BPA/APPA and BPA/APPA variants. The table lists the number of different operations required to decode one row in H. For one iteration these numbers need to be multiplied with M=ZS. However, Z of them will be performed in parallel. In Table 2, PAR lists the parameters used in the algorithm; FIND is the number of smallest $\beta_k$ that has to be found out of the $d_c$ edges connected to the check node; MIN is the number of two-input min or max operations (min or max operations with one input equal to zero are disregarded); LUT is the number of times a look-up table is needed; ADD is the number of additions/subtractions; MULT is the number of multiplications. Note that by choosing the scaling to $A \in (2^{-j}, 1-2^{-j})$, for j=0, 1, 2, . . . simplifies the multiplications significantly.

These approaches can be denoted as ABPA, ASBPA, ALBPA, and ASLBPA, where the approximation technique is applied to BPA, SBPA, LBPA, and SLBPA, respectively. If $Q=d_c$, ABPA, ASBPA, ALBPA, and ASLBPA reduce to BPA, SBPA, LBPA, and SLBPA, respectively. When Q=2, $F_1^* \approx \beta_2^*$, $F_2^* \beta_1^*$, $F_k^* \beta_1^* \boxplus \beta_2^*$, for all k≧3. When Q=3, $F_1^* \approx \beta_2^* \boxplus \beta_3^*$, $F_2^* \beta_1^* \boxplus \beta_3^*$, $F_3^* \approx \beta_1^* \boxplus \beta_2^*$, $F_k^* \approx \beta_1^* \boxplus \beta_2^* \boxplus \beta_3^*$ for all k≧4.

The APPA can be approximated by only using the Q first $\beta_i^*$ in the calculation of $F_k^*$. Note that the Q smallest $\beta_k$ has to be found and sorted beforehand, in contrast to APPA where the $\beta_k$ do not need to be sorted. For approximated APPA (AAPPA), $$F_k^* \approx \Sigma(i=1 \ldots d_c) \boxplus \beta_i^*, \text{ for all } k \geq 1, \text{ where } Q \in \{2, 3, \ldots, d_c\}. \quad (27)$$

In contrast to the APPA (that is a lower bound), the AAPPA is not a lower or an upper bound. Any of the approximations described earlier in SBPA, LBPA, and SLBPA can be used as the BP operation in the AAPPA. These approaches will then be referred to as ASAPPA, ALAPPA, and ASLAPPA, respectively.

As in BPA-APPA, where a combination of BPA and APPA is used, other combinations can be formulated. For example the combination of MSA and AAPPA according to $$F_1^* \approx \beta_2^*, F_k^* \Sigma(i=1 \ldots Q) \boxplus \beta_i^*, \text{ for all } k \geq 2, \text{ where } Q \in \{2, 3, \ldots, d_c\}. \quad (28)$$

TABLE 2

Relative Complexity of SPA/BPA/APPA and BPA/APPA variants

| | PAR | FIND | MIN | LUT | ADD | MULT |
|---|---|---|---|---|---|---|
| SPA | — | — | — | $2d_c$ | $2d_c - 1$ | — |
| BPA | — | — | $3d_c - 6$ | $6d_c - 12$ | $12d_c - 24$ | — |
| SBPA | — | — | $3d_c - 6$ | $3d_c - 6$ | $6d_c - 12$ | — |
| LBPA | A, B | — | $3d_c - 6$ | — | $18d_c - 36$ | $6d_c - 12$ |
| SLBPA | A, B | — | $3d_c - 6$ | — | $9d_c - 18$ | $3d_c - 6$ |
| APPA | — | — | $d_c - 1$ | $2d_c - 2$ | $4d_c - 4$ | — |
| SAPPA | — | — | $d_c - 1$ | $1d_c - 1$ | $2d_c - 2$ | — |
| LAPPA | A, B | — | $d_c - 1$ | — | $6d_c - 6$ | $2d_c - 2$ |
| SLAPPA | A, B | — | $d_c - 1$ | — | $3d_c - 3$ | $d_c - 1$ |
| BPA-APPA | — | — | $d_c - 1$ | $2d_c - 2$ | $4d_c - 4$ | — |
| SBPA-SAPPA | — | — | $d_c - 1$ | $1d_c - 1$ | $2d_c - 2$ | — |
| LBPA-LAPPA | A, B | — | $d_c - 1$ | — | $6d_c - 6$ | $2d_c - 2$ |
| SLBPA-SLAPPA | A, B | — | $d_c - 1$ | — | $3d_c - 3$ | $d_c - 1$ |

Advantageously, using an approximation engine, such as the approximation engine 912 (FIG. 9) an approximate SPA (ASPA) can be used. SPA can be approximated by using the Q first $\beta_i^*$ in the calculation of $F_k^*$ (the upper bound in (17)). With ASPA, the Q smallest $\beta_k$ has to be found and sorted beforehand, in contrast to SPA where the $\beta_k$ do not need to be sorted. When $Q=d_c$, ASPA reduces to SPA. When Q=2, $F_1^* \approx \beta_2^*$, $F_2^* \approx \beta_1^*$, $F_k^* \approx \phi(\phi(\beta_1^*) + \phi(\beta_2^*))$, for all k≧3. When Q=3, $F_1^* \approx \phi(\phi(\beta_2^*) + \phi(\beta_3^*))$, $F_2^* \approx \phi(\phi(\beta_1^*) + \phi(\beta_3^*))$, $F_3^* \approx \phi(\phi(\beta_1^*) + \phi(\beta_2^*))$, $F_k^* \approx \phi(\phi(\beta_1^*) + \phi(\beta_2^*) + \phi(\beta_3^*))$, for all k≧4. Generally, an ASPA operation can be written as:

$$F_k^* \approx \phi(\Sigma(i=1 \ldots Q, i \neq k)\phi(\beta_i^*)), \text{ where } Q \in \{2, 3, \ldots, d_c\}. \quad (25)$$

Advantageously, using an approximation engine, such as the approximation engine 912 (FIG. 9) an approximate BPA (ABPA) can be used. ABPA and ABPA variants can use the Q first $\beta_i^*$ in the calculation of $F_k^*$ (the upper bound for BPA: $F_k^* \leq \Sigma(i=1 \ldots Q, i \neq k) \boxplus \beta_i^*$, for all $2 \leq Q \leq d_c$ and k≧2). Note that the Q smallest $\beta_k$ has to be found and sorted beforehand, in contrast to BPA where the $\beta_k$ do not need to be sorted. For these approaches, $$F_k^* = \Sigma(i=1 \ldots Q, i \neq k) \boxplus \beta_i^*, \text{ where } Q \in \{2, 3, \ldots, d_c\}. \quad (26)$$

Note that Q smallest $\beta_k$ has to be found and sorted beforehand. When Q=2, $F_1^* \approx \beta_2^*$, $F_k^* \approx \beta_1^* \boxplus \beta_2^*$, for all k≧2. Note that MSA-AAPPA is similar to ABPA when Q=2 (but not the same, since $F_2^*$ is different). When Q=3, $F_1^* \approx \beta_2^*$, $F_k^* \approx \beta_1^* \boxplus \beta_2^* \boxplus \beta_3^*$, for all k≧2. Any of the approximations described earlier in SBPA, LBPA, and SLBPA can be used as the box-plus operation in the MSA-AAPPA. These approaches will then be referred to as MSA-ASAPPA, MSA-ALAPPA, and MSA-ASLAPPA, respectively. Other combinations of the above approaches can also be constructed.

Figure 12:
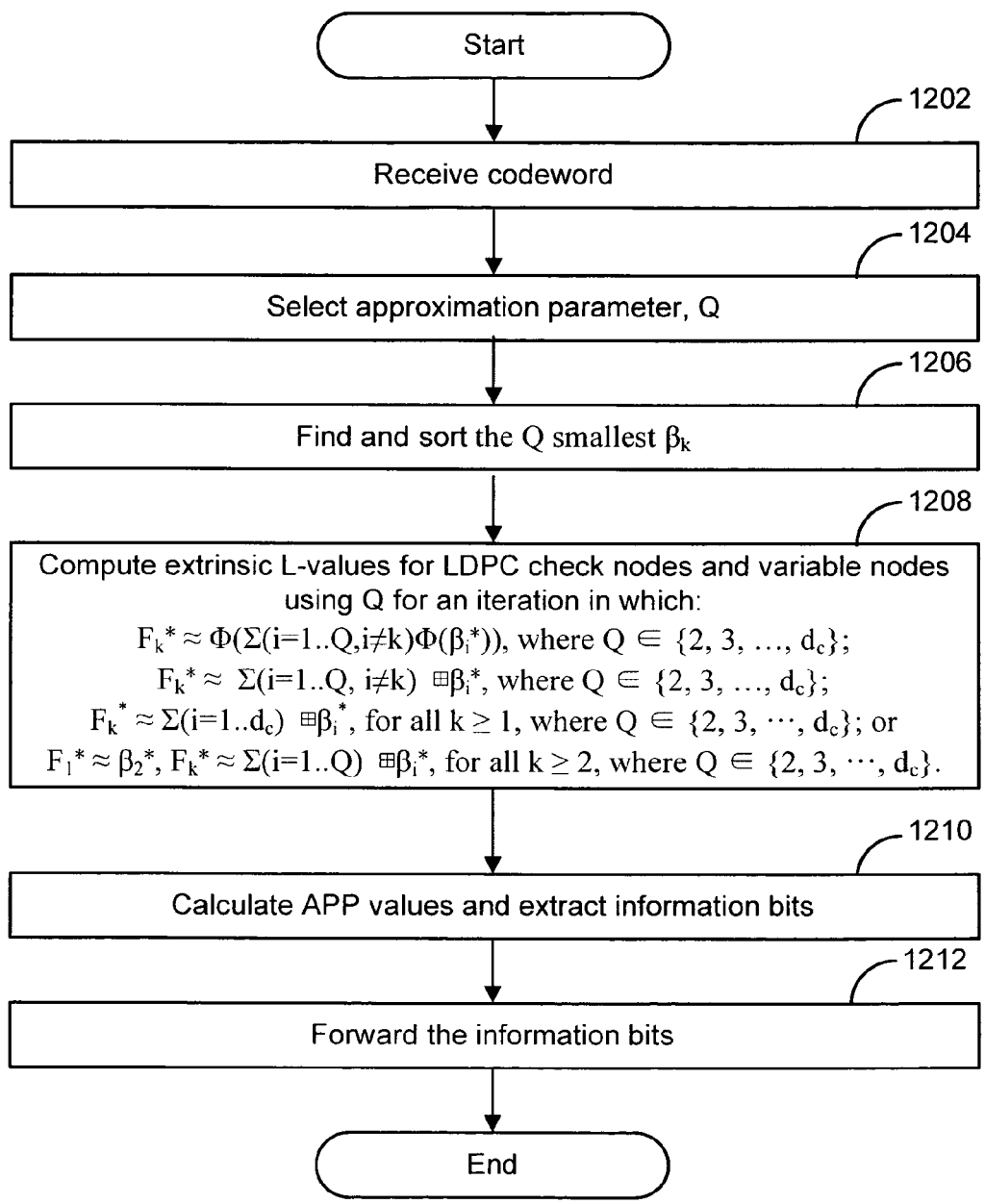
FIG. 12 depicts a flowchart of an example of a method for using an approximated approach.

FIG. 12 depicts a flowchart 1200 of an example of a method for using an approximated approach. The method can be implemented, for example, in a system such as is depicted in FIGS. 1, 3, and/or 9. In the example of FIG. 12, the flowchart 1200 starts at module 1202 with receiving a codeword.

In the example of FIG. 12, the flowchart 1200 continues to module 1204 with selecting an approximation parameter Q. The value appropriate for Q can depend upon the variable itself, circumstances, implementation, configuration, or the like.

In the example of FIG. 12, the flowchart 1200 continues to module 1206 with finding and sorting the Q smallest $\beta_k$.

In the example of FIG. 12, the flowchart 1200 continues to module 1208 with computing extrinsic L-values for LDPC check nodes and variable nodes using Q for an iteration in which: $F_k^* \approx \phi(\Sigma(i=1 \ldots Q, i \neq k)\phi(\beta_i^*))$, where $Q \in \{2, 3, \ldots, d_c\}$; $F_k^* \approx \Sigma(i=1 \ldots Q, i \neq k) \boxplus \beta_i^*$, where $Q \in \{2, 3, \ldots, d_c\}$; $F_k^* \approx \Sigma(i=1 \ldots d_c) \boxplus \beta_i^*$, for all $k \geq 1$, where $Q \in \{2, 3, \ldots, d_c\}$; or $F_1^* \approx \beta_2^*$, $F_k^* \approx \Sigma(i=1 \ldots Q) \boxplus \beta_i^*$, for all $k \geq 2$, where $Q \in \{2, 3, \ldots, d_c\}$. The formula used will depend upon what type of estimation is being made (e.g., ASPA, ABPA, AAPPA, MSA-AAPPA).

In the example of FIG. 12, the flowchart 1200 continues to module 1210 with calculating APP values and extracting information bits. In the example of FIG. 12, the flowchart 1200 ends at module 1212 with forwarding the information bits. Of course, the method can be repeated for subsequently received codewords.

Table 3 illustrates the relative complexity of ASPA/ABPA/AAPPA and variants. The table lists the number of different operations required to decode one row in H. For one iteration these numbers need to be multiplied with M=ZS. However, Z of them will be performed in parallel. In Table 3, PAR lists the parameters used in the algorithm; FIND is the number of smallest $\beta_k$ that has to be found out of the $d_c$ edges connected to the check node; MIN is the number of two-input min or max operations (min or max operations with one input equal to zero are disregarded); LUT is the number of times a look-up table is needed; ADD is the number of additions/subtractions; MULT is the number of multiplications.

TABLE 3

Relative Complexity of ASPA/ABPA/AAPPA and variants

| | PAR | FIND | MIN | LUT | ADD | MULT |
|---|---|---|---|---|---|---|
| ASPA | Q | Q | — | 2Q + 1 | 2Q − 1 | — |
| ABPA | Q | Q | 3Q − 5 | 6Q − 10 | 12Q − 20 | — |
| ASBPA | Q | Q | 3Q − 5 | 3Q − 5 | 6Q − 10 | — |
| ALBPA | Q, A, B | Q | 3Q − 5 | — | 18Q − 30 | 6Q − 10 |
| ASLBPA | Q, A, B | Q | 3Q − 5 | — | 9Q − 15 | 3Q − 5 |
| AAPPA | Q | Q | Q − 1 | 2Q − 2 | 4Q − 4 | — |
| ASAPPA | Q | Q | Q − 1 | Q − 1 | 2Q − 3 | — |
| ALAPPA | Q, A, B | Q | Q − 1 | — | 6Q − 6 | 2Q − 2 |
| ASLAPPA | Q, A, B | Q | Q − 1 | — | 3Q − 3 | Q − 1 |
| MSA-AAPPA | Q | Q | Q − 1 | 2Q − 2 | 4Q − 4 | — |
| MSA-ASAPPA | Q | Q | Q − 1 | Q − 1 | 2Q − 2 | — |
| MSA-ALAPPA | Q, A, B | Q | Q − 1 | — | 6Q − 6 | 2Q − 2 |
| MSA-ASLAPPA | Q, A, B | Q | Q − 1 | — | 3Q − 3 | Q − 1 |

As used in this paper, A, B, $q_1$, $q_2$, and Q are identified as parameters for use in computation of an extrinsic L-value for a check node. Accordingly, the parameters can be referred to as extrinsic L-value computation parameters or check node parameters. Where one parameter is specifically identified, it can be referred to as an attenuation parameter, A, a bias parameter, B, a design parameter, $q_n$, or an approximation parameter, Q. Q can also be referred to as node-limiting parameter because it reduces the number of computations associated with a node when computing an extrinsic L-value for a check node. The parameters A, B, $q_n$ can be referred to in the aggregate as check node bounding parameters. Where $q_n$ is associated with attenuation, A and $q_n$ can be referred to as attenuation parameters. Where $q_n$ is associated with bias, B and $q_n$ can be referred to as bias parameters.

Figure 13:
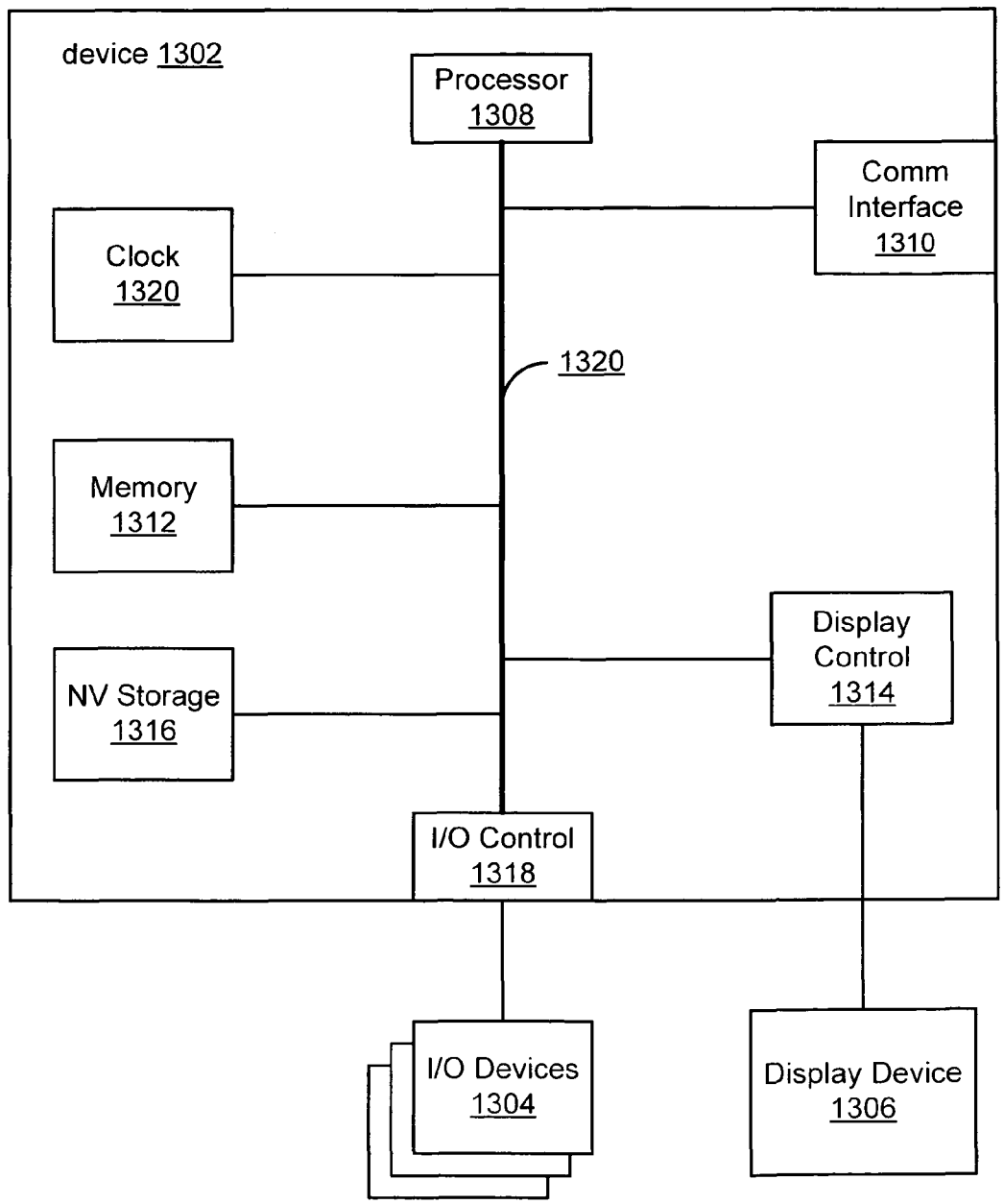
FIG. 13 depicts an example of a system capable of performing methods and implementing engines described herein.

FIG. 13 depicts an example of a system 1300 capable of performing methods and implementing engines described in this paper. The system 1300 can include a computer system that can be used as a client computer system, such as a wireless client or a workstation, or a server computer system.

The computer system 1300 includes a device 1302, I/O devices 1304, and a display device 1306. The device 1302 includes a processor 1308, a communications interface 1310, memory 1312, display controller 1314, non-volatile storage 1316, I/O controller 1318, clock 1320. The device 1302 may be coupled to or include the I/O devices 1304 and/or display device 1306.

The device 1302 interfaces to external systems through the communications interface 1310, which may include a modem, network interface, or some other known or convenient interface. It will be appreciated that the communications interface 1310 can be considered to be part of the system 1300 or a part of the device 1302. The communications interface 1310 can be an analog modem, ISDN modem, cable modem, token ring interface, ethernet interface, wireless 802.11 interface, satellite transmission interface (e.g. "direct PC"), or other interfaces for coupling a computer system to other computer systems.

The processor 1308 may be, for example, a microprocessor such as an Intel Pentium microprocessor or Motorola power PC microprocessor. The memory 1312 is coupled to the processor 1308 by a bus 1320. The memory 1312 can be Dynamic Random Access Memory (DRAM) and can also include Static RAM (SRAM). The bus 1320 couples the processor 1308 to the memory 1312, also to the non-volatile storage 1316, to the display controller 1314, and to the I/O controller 1318.

The I/O devices 1304 can include a keyboard, disk drives, printers, a scanner, and other input and output devices, including a mouse or other pointing device. The display controller 1314 may control in the conventional manner a display on the display device 1306, which can be, for example, a cathode ray tube (CRT) or liquid crystal display (LCD). The display controller 1314 and the I/O controller 1318 can be implemented with conventional well known technology.

The non-volatile storage 1316 is can include a magnetic hard disk, an optical disk, or another form of storage for large amounts of data. Some of this data is often written, by a direct memory access process, into memory 1312 during execution of software in the device 1302.

Clock 1320 can be any kind of oscillating circuit creating an electrical signal with a precise frequency. In a non-limiting example, clock 1320 could be a crystal oscillator using the mechanical resonance of vibrating crystal to generate the electrical signal.

The system 1300 is one example of many possible computer systems which have different architectures. For example, personal computers based on an Intel microprocessor often have multiple buses, one of which can be an I/O bus for the peripherals and one that directly connects the processor 1308 and the memory 1312 (often referred to as a memory bus). The buses are connected together through bridge components that perform any necessary translation due to differing bus protocols.

Network computers are another type of computer system that can be used in conjunction with the teachings provided herein. Network computers do not usually include a hard disk or other mass storage, and the executable programs are loaded from a network connection into the memory 1312 for execution by the processor 1308. A Web TV system is also considered to be a computer system, but it may lack some of the features shown in FIG. 13, such as certain input or output devices. A typical computer system will usually include at least a processor, memory, and a bus coupling the memory to the processor.

In addition, the system 1300 is controlled by operating system software which includes a file management system, such as a disk operating system, which is part of the operating system software. One example of operating system software with its associated file management system software is the family of operating systems known as Windows® from Microsoft Corporation of Redmond, Wash., and their associated file management systems. Another example of operating system software with its associated file management system software is the Linux operating system and its associated file management system. The file management system is typically stored in the non-volatile storage 1316 and causes the processor 1308 to execute the various acts required by the operating system to input and output data and to store data in memory, including storing files on the non-volatile storage 1316.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the relevant art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The device 1300 may be specially constructed for required purposes, or it may comprise a general purpose computer specially-purposed to perform certain tasks. Such a computer program may be stored in a computer readable storage medium, such as, but is not limited to, read-only memories (ROMs), random access memories (RAMs), EPROMs, EEPROMs, magnetic or optical cards, any type of disk including floppy disks, optical disks, CD-ROMs, and magnetic-optical disks, or any type of media suitable for storing electronic instructions, and each coupled to a computer system bus.

Systems described in this paper may be implemented on any of many possible hardware, firmware, and software systems. Algorithms described herein are implemented in hardware, firmware, and/or software that is implemented in hardware. The specific implementation is not critical to an understanding of the techniques described herein and the claimed subject matter.

As used in this paper, an engine includes a dedicated or shared processor and, hardware, firmware, or software modules that are executed by the processor. Depending upon implementation-specific or other considerations, an engine can be centralized or its functionality distributed. An engine can include special purpose hardware, firmware, or software embodied in a computer-readable medium for execution by the processor. As used in this paper, the term "computer-readable storage medium" is intended to include only physical media, such as memory. As used in this paper, a computer-readable medium is intended to include all mediums that are statutory (e.g., in the United States, under 35 U.S.C. 101), and to specifically exclude all mediums that are non-statutory in nature to the extent that the exclusion is necessary for a claim that includes the computer-readable medium to be valid. Known statutory computer-readable mediums include hardware (e.g., registers, random access memory (RAM), non-volatile (NV) storage, to name a few), but may or may not be limited to hardware. Data stores, including tables, are intended to be implemented in computer-readable storage media. Though the data would be stored on non-ephemeral media in order for the media to qualify as "storage media," it is possible to store data in temporary (e.g., dynamic) memory.

As used in this paper, the term "embodiment" means an embodiment that serves to illustrate by way of example but not necessarily by limitation.

It will be appreciated to those skilled in the relevant art that the preceding examples and embodiments are exemplary and not limiting to the scope of the present invention. It is intended that all permutations, enhancements, equivalents, and improvements thereto that are apparent to those skilled in the art upon a reading of the specification and a study of the drawings are included within the true spirit and scope of the present invention. It is therefore intended that the following appended claims include all such modifications, permutations and equivalents as fall within the true spirit and scope of the present invention.

The invention claimed is:
1. A method comprising
receiving a codework;
repeating until no new values for an extrinsic L-value computation (ELC) parameter are called for in association with decoding the codeword:
 selecting an ELC parameter value from a plurality of values based upon a variable;
 computing extrinsic L-values for low-density parity-check (LDPC) check nodes and variable nodes using the ELC parameter for one or more iterations;
calculating a posteriori probability (APP) L-values for the codeword;

extracting information bits associated with the decoded codeword;

forwarding the information bits; and computing the extrinsic L-values using an approach selected from the group of approaches consisting of: sum-product (SP), box-plus (BP), a posteriori probability (APP), variations of these, and combinations of these.

2. A method comprising receiving a codeword;

repeating until no new values for an extrinsic L-value computation (ELC) parameter are called for in association with decoding the codeword:

selecting an ELC parameter value from a plurality of values based upon a variable;

computing extrinsic L-values for low-density parity-check (LDPC) check nodes and variable nodes using the ELC parameter for one or more iterations;

calculating a posteriori probability (APP) L-values for the codeword;

extracting information bus associated with the decoded codeword;

forwarding the information bits; and computing the extrinsic L-values using an approximation selected from the group of approximations consisting of: min-sum (MS), linear (L), offset (O), non-linear (NL), variations of these, and combinations of these.

3. A system comprising:

codeword buffer;

an offset engine;

a low density parity-check (LDPC) decoding engine coupled to the codeword buffer and the offset engine;

a data buffer coupled to the LDPC decoding engine;

wherein, in operation, the codeword buffer contains a codeword;

the offset engine provides a bias parameter, B, where $0 \leq B \leq \ln(d_c-1)$ to the LDPC decoding engine, wherein '$d_c$' is a number of edges going into a check node, and further wherein 'ln' is a natural log;

the LDPC decoding engine computes extrinsic L-values for low-density parity-check (LDPC) check nodes and variable nodes using the bias parameter;

the LDPC decoding engine calculates a posteriori probability (APP) L-values for the codeword and extracts information bits associated with the decoded codeword;

the data buffer has the information bits associated with the decoded codeword.

4. The system of claim 3, wherein the bias parameter is selected from the group of parameters consisting of a bias parameter (B), an design parameter (q), or a combination of these.

5. The system of claim 3, further comprising,:

an attenuation engine coupled to e LDPC decoding engine, wherein, in operation, the attenuation engine provides an attenuation parameter to the LDPC decoding engine;

the LDPC decoding engine computes extrinsic L-values for LDPC check nodes and variable nodes using the attenuation parameter.

6. The system of claim 5, wherein the attenuation parameter is selected from the group of parameters consisting of an attenuation parameter (A), a design parameter (q), or a combination of these.

7. The system of claim 3, further comprising:

an approximation engine coupled to the LDPC decoding engine, wherein, in operation, the approximation engine provides a node-limiting parameter (Q) to the LDPC decoding engine; the LDPC decoding engine computes extrinsic L-values for LDPC check nodes and variable nodes using the node-limiting parameter.

8. The system of claim 3, further comprising:

a φ lookup table coupled to the LDPC decoding engine, wherein, in operation, the approximation engine provides a φ value to the LDPC decoding engine, wherein $\phi(x)=\ln[(\exp(x)+1)/(\exp(x)-1)]$ and the φ value is associated with a value derived from the function φ(x);

the LDPC decoding engine computes extrinsic L-values for LDPC check nodes and variable nodes using the φ value.

9. The system of claim 3, wherein the LDPC decoding engine implements an approach selected from the group of approaches consisting of: sum-product (SP), box-plus (BP), a posteriori probability (APP), and a combination of these, and wherein the LDPC decoding engine computes the extrinsic L-value for the check node in association with the codeword in accordance with the implemented approach.

10. The system of claim 3, wherein the LDPC decoding engine uses an approximation selected from the group of approximations consisting of min-sum (MS), linear (L), offset (O), or non-linear (NL), and wherein the LDPC decoding engine computes the extrinsic L-value fur the check node in association with the codeword in accordance with the implemented approximation.

* * * * *

UNITED STATES PATENT AND TRADEMARK OFFICE
CERTIFICATE OF CORRECTION

PATENT NO. : 8,407,551 B2
APPLICATION NO. : 12/653657
DATED : March 26, 2013
INVENTOR(S) : Fredrik Brannstrom and Andrea Goldsmith It is certified that error appears in the above-identified patent and that said Letters Patent is hereby corrected as shown below:

On the Title Page, item (54), and in the specification, Column 1, Line 1, Title:
Please delete "LDCP" and insert -- LDPC --

Signed and Sealed this
Twenty-third Day of July, 2013

Teresa Stanek Rea
*Acting Director of the United States Patent and Trademark Office*